(12) United States Patent
Czinger et al.

(10) Patent No.: US 10,960,468 B2
(45) Date of Patent: Mar. 30, 2021

(54) STRESS-BASED METHOD FOR OPTIMIZATION OF JOINT MEMBERS WITHIN A COMPLEX STRUCTURE

(71) Applicant: Divergent Technologies, Inc., Los Angeles, CA (US)

(72) Inventors: Kevin Robert Czinger, Santa Monica, CA (US); William Bradley Balzer, Santa Monica, CA (US); Praveen Varma Penmetsa, Long Beach, CA (US); Zachary Meyer Omohundro, Hermosa Beach, CA (US); Matthew M. O'Brien, Hermosa Beach, CA (US)

(73) Assignee: Divergent Technologies, Inc., Los Angeles, CA (US)

( * ) Notice: Subject to any disclaimer, the term of this patent is extended or adjusted under 35 U.S.C. 154(b) by 0 days.

(21) Appl. No.: 15/809,528

(22) Filed: Nov. 10, 2017

(65) Prior Publication Data
US 2018/0085827 A1    Mar. 29, 2018

Related U.S. Application Data

(62) Division of application No. 14/788,154, filed on Jun. 30, 2015, now Pat. No. 9,975,179.
(Continued)

(51) Int. Cl.
*B62D 27/02* (2006.01)
*B33Y 80/00* (2015.01)
(Continued)

(52) U.S. Cl.
CPC .............. *B22F 3/1055* (2013.01); *B22F 5/10* (2013.01); *B62D 21/17* (2013.01); *B62D 23/005* (2013.01);
(Continued)

(58) Field of Classification Search
CPC .. B22F 3/1055; B22F 5/10; B22F 2003/1057; B22F 2999/00; B22F 3/10; B22F 7/06;
(Continued)

(56) References Cited

U.S. PATENT DOCUMENTS 2,421,351 A    5/1947   Page
3,292,969 A    12/1966  Eggert, Jr.
(Continued)

FOREIGN PATENT DOCUMENTS

CA    2818928 A1    6/2012
CN    87102543 A    10/1988
(Continued)

OTHER PUBLICATIONS

US 9,202,136 B2, 12/2015, Schmidt et al. (withdrawn)
(Continued)

*Primary Examiner* — Lawrence Averick
(74) *Attorney, Agent, or Firm* — Arent Fox LLP

(57) ABSTRACT

A method for fabricating a joint designed to connect tubes for a space frame, where a space frame may be a vehicle chassis, is provided. The method may generate joints with variable geometry and fine features which may reduce production costs, reduce production time, and generate joints configured for highly specific applications. The joint may include centering features which may create a space between a surface of the tube and a surface of the joint through which adhesive may flow.

16 Claims, 9 Drawing Sheets

Related U.S. Application Data

(60) Provisional application No. 62/020,084, filed on Jul. 2, 2014.

(51) Int. Cl.

| | |
|---|---|
| *B33Y 50/02* | (2015.01) |
| *B29C 64/386* | (2017.01) |
| *B22F 3/105* | (2006.01) |
| *B62D 21/17* | (2006.01) |
| *B22F 5/10* | (2006.01) |
| *B62D 23/00* | (2006.01) |
| *F16B 11/00* | (2006.01) |
| *G06F 30/15* | (2020.01) |
| *G06F 30/17* | (2020.01) |
| *B29L 31/24* | (2006.01) |

(52) U.S. Cl.
CPC .......... *B62D 27/023* (2013.01); *F16B 11/008* (2013.01); *G06F 30/15* (2020.01); *G06F 30/17* (2020.01); *B22F 2003/1057* (2013.01); *B22F 2998/10* (2013.01); *B22F 2999/00* (2013.01); *B29C 64/386* (2017.08); *B29L 2031/24* (2013.01); *B33Y 50/02* (2014.12); *B33Y 80/00* (2014.12); *Y02P 10/25* (2015.11)

(58) Field of Classification Search
CPC ............ B22F 2998/10; B22F 2003/247; B22F 7/002; F16B 11/008; B62D 23/005; B62D 27/023; B62D 21/17; B62D 33/044; B29L 2031/24; B29L 2031/26; B33Y 50/02; B33Y 80/00; Y02P 10/295; B29C 64/386; B29C 64/153; G06F 17/5095

See application file for complete search history.

(56) References Cited

U.S. PATENT DOCUMENTS

| | | |
|---|---|---|
| 3,665,670 A | 5/1972 | Rummler |
| 3,756,635 A | 9/1973 | Beers |
| 4,259,821 A | 4/1981 | Bush |
| 4,557,097 A | 12/1985 | Mikulas, Jr. |
| 4,583,755 A | 4/1986 | Diekman |
| 4,618,163 A | 10/1986 | Hasler et al. |
| 4,660,345 A | 4/1987 | Browning |
| 4,721,407 A | 1/1988 | Liu |
| 4,735,355 A | 4/1988 | Browning |
| 4,804,209 A | 2/1989 | Fischer |
| 4,950,522 A | 8/1990 | Vogt |
| 5,116,071 A | 5/1992 | Calfee |
| D331,378 S | 12/1992 | Muller |
| 5,203,226 A | 4/1993 | Hongou et al. |
| 5,262,121 A | 11/1993 | Goodno |
| 5,272,805 A | 12/1993 | Akeel et al. |
| 5,346,237 A | 9/1994 | Wang |
| 5,458,393 A | 10/1995 | Benedyk |
| 5,478,100 A | 12/1995 | McDermitt, Jr. |
| 5,720,092 A | 2/1998 | Ni et al. |
| 5,720,511 A | 2/1998 | Benedyk |
| 5,742,385 A | 4/1998 | Champa |
| 5,848,853 A | 12/1998 | Clenet |
| 5,917,726 A | 6/1999 | Pryor |
| 5,944,441 A | 8/1999 | Schutze |
| 5,990,444 A | 11/1999 | Costin |
| 6,010,155 A | 1/2000 | Rinehart |
| 6,010,182 A | 1/2000 | Townsend |
| 6,096,249 A | 8/2000 | Yamaguchi |
| 6,140,602 A | 10/2000 | Costin |
| 6,170,596 B1 | 1/2001 | Triarsi et al. |
| 6,247,869 B1 | 6/2001 | Lichvar |
| 6,250,533 B1 | 6/2001 | Otterbein et al. |
| 6,252,196 B2 | 6/2001 | Costin et al. |
| 6,318,642 B1 | 11/2001 | Goenka et al. |
| 6,349,237 B1 | 2/2002 | Koren et al. |
| 6,357,822 B1 | 3/2002 | Panoz et al. |
| 6,365,057 B1 | 4/2002 | Whitehurst et al. |
| 6,391,251 B1 | 5/2002 | Keicher et al. |
| 6,409,930 B1 | 6/2002 | Whitehurst et al. |
| 6,412,857 B2 | 7/2002 | Jaekel |
| 6,468,439 B1 | 10/2002 | Whitehurst et al. |
| 6,470,990 B1 | 10/2002 | Panoz |
| 6,554,345 B2 | 4/2003 | Jonsson |
| 6,585,151 B1 | 7/2003 | Ghosh |
| 6,630,093 B1 | 10/2003 | Jones |
| 6,644,721 B1 | 11/2003 | Miskech et al. |
| 6,665,935 B2 | 12/2003 | Panoz |
| 6,811,744 B2 | 11/2004 | Keicher et al. |
| 6,866,497 B2 | 3/2005 | Saiki |
| 6,919,035 B1 | 7/2005 | Clough |
| 6,926,970 B2 | 8/2005 | James et al. |
| 7,000,936 B2 | 2/2006 | Schmider |
| 7,044,535 B2 | 5/2006 | Durand |
| 7,133,812 B1 | 11/2006 | Weber |
| 7,152,292 B2 | 12/2006 | Hohmann et al. |
| 7,270,346 B2 | 9/2007 | Rowe et al. |
| 7,341,285 B2 | 3/2008 | McPherson |
| 7,344,186 B1 | 3/2008 | Hausler et al. |
| 7,500,373 B2 | 3/2009 | Quell |
| 7,552,569 B2 * | 6/2009 | Rotherroe ............... E04C 3/32 52/839 |
| 7,586,062 B2 | 9/2009 | Heberer |
| 7,637,134 B2 | 12/2009 | Burzlaff et al. |
| 7,710,347 B2 | 5/2010 | Gentilman et al. |
| 7,716,802 B2 | 5/2010 | Stern et al. |
| 7,745,293 B2 | 6/2010 | Yamazaki et al. |
| 7,766,123 B2 | 8/2010 | Sakurai et al. |
| 7,852,388 B2 | 12/2010 | Shimizu et al. |
| 7,908,922 B2 | 3/2011 | Zarabadi et al. |
| 7,951,324 B2 | 5/2011 | Naruse et al. |
| 8,070,216 B2 | 12/2011 | Defoy et al. |
| 8,094,036 B2 | 1/2012 | Heberer |
| 8,163,077 B2 | 4/2012 | Eron et al. |
| 8,286,236 B2 | 10/2012 | Jung et al. |
| 8,289,352 B2 | 10/2012 | Vartanian et al. |
| 8,297,096 B2 | 10/2012 | Mizumura et al. |
| 8,317,257 B2 | 11/2012 | Rolfe et al. |
| 8,354,170 B1 | 1/2013 | Henry et al. |
| 8,383,028 B2 | 2/2013 | Lyons |
| 8,408,036 B2 | 4/2013 | Reith et al. |
| 8,429,754 B2 | 4/2013 | Jung et al. |
| 8,437,513 B1 | 5/2013 | Derakhshani et al. |
| 8,444,903 B2 | 5/2013 | Lyons et al. |
| 8,452,073 B2 | 5/2013 | Taminger et al. |
| 8,528,291 B2 | 9/2013 | Allred, III et al. |
| 8,530,015 B2 | 9/2013 | Mendiboure |
| 8,544,587 B2 | 10/2013 | Holroyd et al. |
| 8,590,654 B2 | 11/2013 | Kerner et al. |
| 8,599,301 B2 | 12/2013 | Dowski, Jr. et al. |
| 8,606,540 B2 | 12/2013 | Haisty et al. |
| 8,610,761 B2 | 12/2013 | Haisty et al. |
| 8,631,996 B2 | 1/2014 | Quell et al. |
| 8,675,925 B2 | 3/2014 | Derakhshani et al. |
| 8,678,060 B2 | 3/2014 | Dietz et al. |
| 8,686,314 B2 | 4/2014 | Schneegans et al. |
| 8,686,997 B2 | 4/2014 | Radet et al. |
| 8,694,284 B2 | 4/2014 | Berard |
| 8,720,876 B2 | 5/2014 | Reith et al. |
| 8,752,166 B2 | 6/2014 | Jung et al. |
| 8,755,923 B2 | 6/2014 | Farahani et al. |
| 8,787,628 B1 | 7/2014 | Derakhshani et al. |
| 8,818,771 B2 | 8/2014 | Gielis et al. |
| 8,873,238 B2 | 10/2014 | Wilkins |
| 8,978,535 B2 | 3/2015 | Ortiz et al. |
| 8,998,307 B1 | 4/2015 | Joyce |
| 9,006,605 B2 | 4/2015 | Schneegans et al. |
| 9,071,436 B2 | 6/2015 | Jung et al. |
| 9,101,979 B2 | 8/2015 | Hofmann et al. |
| 9,104,921 B2 | 8/2015 | Derakhshani et al. |
| 9,126,365 B1 | 9/2015 | Mark et al. |
| 9,128,476 B2 | 9/2015 | Jung et al. |
| 9,138,924 B2 | 9/2015 | Yen |

(56) References Cited

U.S. PATENT DOCUMENTS

| | | |
|---|---|---|
| 9,149,988 B2 | 10/2015 | Mark et al. |
| 9,156,205 B2 | 10/2015 | Mark et al. |
| 9,186,848 B2 | 11/2015 | Mark et al. |
| 9,244,986 B2 | 1/2016 | Karmarkar |
| 9,248,611 B2 | 2/2016 | Divine et al. |
| 9,254,535 B2 | 2/2016 | Buller et al. |
| 9,266,566 B2 | 2/2016 | Kim |
| 9,269,022 B2 | 2/2016 | Rhoads et al. |
| 9,327,452 B2 | 5/2016 | Mark et al. |
| 9,329,020 B1 | 5/2016 | Napoletano |
| 9,332,251 B2 | 5/2016 | Haisty et al. |
| 9,346,127 B2 | 5/2016 | Buller et al. |
| 9,389,315 B2 | 7/2016 | Bruder et al. |
| 9,399,256 B2 | 7/2016 | Buller et al. |
| 9,403,235 B2 | 8/2016 | Buller et al. |
| 9,418,193 B2 | 8/2016 | Dowski, Jr. et al. |
| 9,457,514 B2 | 10/2016 | Schwärzler |
| 9,469,057 B2 | 10/2016 | Johnson et al. |
| 9,478,063 B2 | 10/2016 | Rhoads et al. |
| 9,481,402 B1 | 11/2016 | Muto et al. |
| 9,486,878 B2 | 11/2016 | Buller et al. |
| 9,486,960 B2 | 11/2016 | Paschkewitz et al. |
| 9,502,993 B2 | 11/2016 | Deng |
| 9,525,262 B2 | 12/2016 | Stuart et al. |
| 9,533,526 B1 | 1/2017 | Nevins |
| 9,555,315 B2 | 1/2017 | Aders |
| 9,555,580 B1 | 1/2017 | Dykstra et al. |
| 9,557,856 B2 | 1/2017 | Send et al. |
| 9,566,742 B2 | 2/2017 | Keating et al. |
| 9,566,758 B2 | 2/2017 | Cheung et al. |
| 9,567,013 B2 | 2/2017 | Ehrlich et al. |
| 9,573,193 B2 | 2/2017 | Buller et al. |
| 9,573,225 B2 | 2/2017 | Buller et al. |
| 9,586,290 B2 | 3/2017 | Buller et al. |
| 9,595,795 B2 | 3/2017 | Lane et al. |
| 9,597,843 B2 | 3/2017 | Stauffer et al. |
| 9,600,929 B1 | 3/2017 | Young et al. |
| 9,609,755 B2 | 3/2017 | Coull et al. |
| 9,610,737 B2 | 4/2017 | Johnson et al. |
| 9,611,667 B2 | 4/2017 | GangaRao et al. |
| 9,616,623 B2 | 4/2017 | Johnson et al. |
| 9,626,487 B2 | 4/2017 | Jung et al. |
| 9,626,489 B2 | 4/2017 | Nilsson |
| 9,643,361 B2 | 5/2017 | Liu |
| 9,662,840 B1 | 5/2017 | Buller et al. |
| 9,665,182 B2 | 5/2017 | Send et al. |
| 9,672,389 B1 | 6/2017 | Mosterman et al. |
| 9,672,550 B2 | 6/2017 | Apsley et al. |
| 9,676,145 B2 | 6/2017 | Buller et al. |
| 9,684,919 B2 | 6/2017 | Apsley et al. |
| 9,688,032 B2 | 6/2017 | Kia et al. |
| 9,690,286 B2 | 6/2017 | Hovsepian et al. |
| 9,700,966 B2 | 7/2017 | Kraft et al. |
| 9,703,896 B2 | 7/2017 | Zhang et al. |
| 9,713,903 B2 | 7/2017 | Paschkewitz et al. |
| 9,718,302 B2 | 8/2017 | Young et al. |
| 9,718,434 B2 | 8/2017 | Hector, Jr. et al. |
| 9,724,877 B2 | 8/2017 | Flitsch et al. |
| 9,724,881 B2 | 8/2017 | Johnson et al. |
| 9,725,178 B2 | 8/2017 | Wang |
| 9,731,730 B2 | 8/2017 | Stiles |
| 9,731,773 B2 | 8/2017 | Gami et al. |
| 9,741,954 B2 | 8/2017 | Bruder et al. |
| 9,747,352 B2 | 8/2017 | Karmarkar |
| 9,764,415 B2 | 9/2017 | Seufzer et al. |
| 9,764,520 B2 | 9/2017 | Johnson et al. |
| 9,765,226 B2 | 9/2017 | Dain |
| 9,770,760 B2 | 9/2017 | Liu |
| 9,773,393 B2 | 9/2017 | Velez |
| 9,776,234 B2 | 10/2017 | Schaafhausen et al. |
| 9,782,936 B2 | 10/2017 | Glunz et al. |
| 9,783,324 B2 | 10/2017 | Embler et al. |
| 9,783,977 B2 | 10/2017 | Alqasimi et al. |
| 9,789,548 B2 | 10/2017 | Golshany et al. |
| 9,789,922 B2 | 10/2017 | Dosenbach et al. |
| 9,796,137 B2 | 10/2017 | Zhang et al. |
| 9,802,108 B2 | 10/2017 | Aders |
| 9,809,977 B2 | 11/2017 | Carney et al. |
| 9,817,922 B2 | 11/2017 | Glunz et al. |
| 9,818,071 B2 | 11/2017 | Jung et al. |
| 9,821,339 B2 | 11/2017 | Paschkewitz et al. |
| 9,821,411 B2 | 11/2017 | Buller et al. |
| 9,823,143 B2 | 11/2017 | Twelves, Jr. et al. |
| 9,829,564 B2 | 11/2017 | Bruder et al. |
| 9,846,933 B2 | 12/2017 | Yuksel |
| 9,854,828 B2 | 1/2018 | Langeland |
| 9,858,604 B2 | 1/2018 | Apsley et al. |
| 9,862,833 B2 | 1/2018 | Hasegawa et al. |
| 9,862,834 B2 | 1/2018 | Hasegawa et al. |
| 9,863,885 B2 | 1/2018 | Zaretski et al. |
| 9,870,629 B2 | 1/2018 | Cardno et al. |
| 9,879,981 B1 | 1/2018 | Dehghan Niri et al. |
| 9,884,663 B2 | 2/2018 | Czinger et al. |
| 9,898,776 B2 | 2/2018 | Apsley et al. |
| 9,914,150 B2 | 3/2018 | Pettersson et al. |
| 9,919,360 B2 | 3/2018 | Buller et al. |
| 9,931,697 B2 | 4/2018 | Levin et al. |
| 9,933,031 B2 | 4/2018 | Bracamonte et al. |
| 9,933,092 B2 | 4/2018 | Sindelar |
| 9,957,031 B2 | 5/2018 | Golshany et al. |
| 9,958,535 B2 | 5/2018 | Send et al. |
| 9,962,767 B2 | 5/2018 | Buller et al. |
| 9,963,978 B2 | 5/2018 | Johnson et al. |
| 9,971,920 B2 | 5/2018 | Derakhshani et al. |
| 9,975,179 B2 | 5/2018 | Czinger et al. |
| 9,976,063 B2 | 5/2018 | Childers et al. |
| 9,987,792 B2 | 6/2018 | Flitsch et al. |
| 9,988,136 B2 | 6/2018 | Tiryaki et al. |
| 9,989,623 B2 | 6/2018 | Send et al. |
| 9,990,565 B2 | 6/2018 | Rhoads et al. |
| 9,994,339 B2 | 6/2018 | Colson et al. |
| 9,996,890 B1 | 6/2018 | Cinnamon et al. |
| 9,996,945 B1 | 6/2018 | Holzer et al. |
| 10,002,215 B2 | 6/2018 | Dowski et al. |
| 10,006,156 B2 | 6/2018 | Kirkpatrick |
| 10,011,089 B2 | 7/2018 | Lyons et al. |
| 10,011,685 B2 | 7/2018 | Childers et al. |
| 10,012,532 B2 | 7/2018 | Send et al. |
| 10,013,777 B2 | 7/2018 | Mariampillai et al. |
| 10,015,908 B2 | 7/2018 | Williams et al. |
| 10,016,852 B2 | 7/2018 | Broda |
| 10,016,942 B2 | 7/2018 | Mark et al. |
| 10,017,384 B1 | 7/2018 | Greer et al. |
| 10,018,576 B2 | 7/2018 | Herbsommer et al. |
| 10,022,792 B2 | 7/2018 | Srivas et al. |
| 10,022,912 B2 | 7/2018 | Kia et al. |
| 10,027,376 B2 | 7/2018 | Sankaran et al. |
| 10,029,415 B2 | 7/2018 | Swanson et al. |
| 10,040,239 B2 | 8/2018 | Brown, Jr. |
| 10,046,412 B2 | 8/2018 | Blackmore |
| 10,048,769 B2 | 8/2018 | Selker et al. |
| 10,052,712 B2 | 8/2018 | Blackmore |
| 10,052,820 B2 | 8/2018 | Kemmer et al. |
| 10,055,536 B2 | 8/2018 | Maes et al. |
| 10,058,764 B2 | 8/2018 | Aders |
| 10,058,920 B2 | 8/2018 | Buller et al. |
| 10,061,906 B2 | 8/2018 | Nilsson |
| 10,065,270 B2 | 9/2018 | Buller et al. |
| 10,065,361 B2 | 9/2018 | Susnjara et al. |
| 10,065,367 B2 | 9/2018 | Brown, Jr. |
| 10,068,316 B1 | 9/2018 | Holzer et al. |
| 10,071,422 B2 | 9/2018 | Buller et al. |
| 10,071,525 B2 | 9/2018 | Susnjara et al. |
| 10,072,179 B2 | 9/2018 | Drijfhout |
| 10,074,128 B2 | 9/2018 | Colson et al. |
| 10,076,875 B2 | 9/2018 | Mark et al. |
| 10,076,876 B2 | 9/2018 | Mark et al. |
| 10,081,140 B2 | 9/2018 | Paesano et al. |
| 10,081,431 B2 | 9/2018 | Seack et al. |
| 10,086,568 B2 | 10/2018 | Snyder et al. |
| 10,087,320 B2 | 10/2018 | Simmons et al. |
| 10,087,556 B2 | 10/2018 | Gallucci et al. |
| 10,099,427 B2 | 10/2018 | Mark et al. |
| 10,100,542 B2 | 10/2018 | GangaRao et al. |

(56) References Cited

U.S. PATENT DOCUMENTS

| | | |
|---|---|---|
| 10,100,890 B2 | 10/2018 | Bracamonte et al. |
| 10,107,344 B2 | 10/2018 | Bracamonte et al. |
| 10,108,766 B2 | 10/2018 | Druckman et al. |
| 10,113,600 B2 | 10/2018 | Bracamonte et al. |
| 10,118,347 B2 | 11/2018 | Stauffer et al. |
| 10,118,579 B2 | 11/2018 | Lakic |
| 10,120,078 B2 | 11/2018 | Bruder et al. |
| 10,124,546 B2 | 11/2018 | Johnson et al. |
| 10,124,570 B2 | 11/2018 | Evans et al. |
| 10,137,500 B2 | 11/2018 | Blackmore |
| 10,138,354 B2 | 11/2018 | Groos et al. |
| 10,144,126 B2 | 12/2018 | Krohne et al. |
| 10,145,110 B2 | 12/2018 | Carney et al. |
| 10,151,363 B2 | 12/2018 | Bracamonte et al. |
| 10,152,661 B2 | 12/2018 | Kieser |
| 10,160,278 B2 | 12/2018 | Coombs et al. |
| 10,161,021 B2 | 12/2018 | Lin et al. |
| 10,166,752 B2 | 1/2019 | Evans et al. |
| 10,166,753 B2 | 1/2019 | Evans et al. |
| 10,171,578 B1 | 1/2019 | Cook et al. |
| 10,173,255 B2 | 1/2019 | TenHouten et al. |
| 10,173,327 B2 | 1/2019 | Kraft et al. |
| 10,174,621 B2 | 1/2019 | Burd |
| 10,178,800 B2 | 1/2019 | Mahalingam et al. |
| 10,179,640 B2 | 1/2019 | Wilkerson |
| 10,183,330 B2 | 1/2019 | Buller et al. |
| 10,183,478 B2 | 1/2019 | Evans et al. |
| 10,189,187 B2 | 1/2019 | Keating et al. |
| 10,189,240 B2 | 1/2019 | Evans et al. |
| 10,189,241 B2 | 1/2019 | Evans et al. |
| 10,189,242 B2 | 1/2019 | Evans et al. |
| 10,190,424 B2 | 1/2019 | Johnson et al. |
| 10,195,693 B2 | 2/2019 | Buller et al. |
| 10,196,539 B2 | 2/2019 | Boonen et al. |
| 10,197,338 B2 | 2/2019 | Melsheimer |
| 10,200,677 B2 | 2/2019 | Trevor et al. |
| 10,201,932 B2 | 2/2019 | Flitsch et al. |
| 10,201,941 B2 | 2/2019 | Evans et al. |
| 10,202,673 B2 | 2/2019 | Lin et al. |
| 10,204,216 B2 | 2/2019 | Nejati et al. |
| 10,207,454 B2 | 2/2019 | Buller et al. |
| 10,209,065 B2 | 2/2019 | Estevo, Jr. et al. |
| 10,210,662 B2 | 2/2019 | Holzer et al. |
| 10,213,837 B2 | 2/2019 | Kondoh |
| 10,214,248 B2 | 2/2019 | Hall et al. |
| 10,214,252 B2 | 2/2019 | Schellekens et al. |
| 10,214,275 B2 | 2/2019 | Goehlich |
| 10,220,575 B2 | 3/2019 | Reznar |
| 10,220,881 B2 | 3/2019 | Tyan et al. |
| 10,221,530 B2 | 3/2019 | Driskell et al. |
| 10,226,900 B1 | 3/2019 | Nevins |
| 10,232,550 B2 | 3/2019 | Evans et al. |
| 10,234,342 B2 | 3/2019 | Moorlag et al. |
| 10,237,477 B2 | 3/2019 | Trevor et al. |
| 10,252,335 B2 | 4/2019 | Buller et al. |
| 10,252,336 B2 | 4/2019 | Buller et al. |
| 10,254,499 B1 | 4/2019 | Cohen et al. |
| 10,257,499 B2 | 4/2019 | Hintz et al. |
| 10,259,044 B2 | 4/2019 | Buller et al. |
| 10,268,181 B1 | 4/2019 | Nevins |
| 10,269,225 B2 | 4/2019 | Velez |
| 10,272,860 B2 | 4/2019 | Mohapatra et al. |
| 10,272,862 B2 | 4/2019 | Whitehead |
| 10,275,564 B2 | 4/2019 | Ridgeway et al. |
| 10,279,580 B2 | 5/2019 | Evans et al. |
| 10,285,219 B2 | 5/2019 | Fetfatsidis et al. |
| 10,286,452 B2 | 5/2019 | Buller et al. |
| 10,286,603 B2 | 5/2019 | Buller et al. |
| 10,286,961 B2 | 5/2019 | Hillebrecht et al. |
| 10,289,263 B2 | 5/2019 | Troy et al. |
| 10,289,875 B2 | 5/2019 | Singh et al. |
| 10,291,193 B2 | 5/2019 | Dandu et al. |
| 10,294,552 B2 | 5/2019 | Liu et al. |
| 10,294,982 B2 | 5/2019 | Gabrys et al. |
| 10,295,989 B1 | 5/2019 | Nevins |
| 10,303,159 B2 | 5/2019 | Czinger et al. |
| 10,307,824 B2 | 6/2019 | Kondoh |
| 10,310,197 B1 | 6/2019 | Droz et al. |
| 10,313,651 B2 | 6/2019 | Trevor et al. |
| 10,315,252 B2 | 6/2019 | Mendelsberg et al. |
| 10,336,050 B2 | 7/2019 | Susnjara |
| 10,337,542 B2 | 7/2019 | Hesslewood et al. |
| 10,337,952 B2 | 7/2019 | Bosetti et al. |
| 10,339,266 B2 | 7/2019 | Urick et al. |
| 10,343,330 B2 | 7/2019 | Evans et al. |
| 10,343,331 B2 | 7/2019 | McCall et al. |
| 10,343,355 B2 | 7/2019 | Evans et al. |
| 10,343,724 B2 | 7/2019 | Polewarczyk et al. |
| 10,343,725 B2 | 7/2019 | Martin et al. |
| 10,350,823 B2 | 7/2019 | Rolland et al. |
| 10,356,341 B2 | 7/2019 | Holzer et al. |
| 10,356,395 B2 | 7/2019 | Holzer et al. |
| 10,357,829 B2 | 7/2019 | Spink et al. |
| 10,357,957 B2 | 7/2019 | Buller et al. |
| 10,359,756 B2 | 7/2019 | Newell et al. |
| 10,369,629 B2 | 8/2019 | Mendelsberg et al. |
| 10,382,739 B1 | 8/2019 | Rusu et al. |
| 10,384,393 B2 | 8/2019 | Xu et al. |
| 10,384,416 B2 | 8/2019 | Cheung et al. |
| 10,389,410 B2 | 8/2019 | Brooks et al. |
| 10,391,710 B2 | 8/2019 | Mondesir |
| 10,392,097 B2 | 8/2019 | Pham et al. |
| 10,392,131 B2 | 8/2019 | Deck et al. |
| 10,393,315 B2 | 8/2019 | Tyan |
| 10,400,080 B2 | 9/2019 | Ramakrishnan et al. |
| 10,401,832 B2 | 9/2019 | Snyder et al. |
| 10,403,009 B2 | 9/2019 | Mariampillai et al. |
| 10,406,750 B2 | 9/2019 | Barton et al. |
| 10,412,283 B2 | 9/2019 | Send et al. |
| 10,416,095 B2 | 9/2019 | Herbsommer et al. |
| 10,421,496 B2 | 9/2019 | Swayne et al. |
| 10,421,863 B2 | 9/2019 | Hasegawa et al. |
| 10,422,478 B2 | 9/2019 | Leachman et al. |
| 10,425,793 B2 | 9/2019 | Sankaran et al. |
| 10,427,364 B2 | 10/2019 | Alves |
| 10,429,006 B2 | 10/2019 | Tyan et al. |
| 10,434,573 B2 | 10/2019 | Buller et al. |
| 10,435,185 B2 | 10/2019 | Divine et al. |
| 10,435,773 B2 | 10/2019 | Liu et al. |
| 10,436,038 B2 | 10/2019 | Buhler et al. |
| 10,438,407 B2 | 10/2019 | Pavanaskar et al. |
| 10,440,351 B2 | 10/2019 | Holzer et al. |
| 10,442,002 B2 | 10/2019 | Benthien et al. |
| 10,442,003 B2 | 10/2019 | Symeonidis et al. |
| 10,449,696 B2 | 10/2019 | Elgar et al. |
| 10,449,737 B2 | 10/2019 | Johnson et al. |
| 10,461,810 B2 | 10/2019 | Cook et al. |
| 2002/0043814 A1 | 4/2002 | Weiman |
| 2002/0050064 A1 | 5/2002 | Furuse et al. |
| 2003/0102668 A1 | 6/2003 | Tarbutton et al. |
| 2003/0230443 A1 | 12/2003 | Cramer et al. |
| 2005/0046166 A1 | 3/2005 | Reim et al. |
| 2005/0138885 A1* | 6/2005 | Rotherroe ............ E04C 3/32 52/843 |
| 2005/0280185 A1 | 12/2005 | Russell et al. |
| 2006/0108783 A1 | 5/2006 | Ni et al. |
| 2007/0222257 A1 | 9/2007 | Flendrig |
| 2007/0246972 A1 | 10/2007 | Favaretto |
| 2009/0014121 A1 | 1/2009 | McPherson |
| 2010/0288569 A1 | 11/2010 | Fish |
| 2011/0158741 A1 | 6/2011 | Knaebel |
| 2011/0167758 A1 | 7/2011 | Daadoush |
| 2012/0090770 A1 | 4/2012 | Cavaliere |
| 2013/0081249 A1 | 4/2013 | McLean |
| 2013/0160295 A1 | 6/2013 | Das et al. |
| 2014/0023812 A1 | 1/2014 | Hammer et al. |
| 2014/0241790 A1 | 8/2014 | Woleader et al. |
| 2014/0277669 A1 | 9/2014 | Nardi et al. |
| 2014/0283104 A1* | 9/2014 | Nilsson ............... G06F 21/10 726/26 |
| 2015/0052025 A1 | 2/2015 | Apsley et al. |
| 2015/0115665 A1 | 4/2015 | Joyce |
| 2016/0016229 A1 | 1/2016 | Czinger et al. |
| 2016/0061381 A1 | 3/2016 | Kotliar |

(56) References Cited

U.S. PATENT DOCUMENTS

| | | | |
|---|---|---|---|
| 2016/0238324 A1 | 8/2016 | Butcher et al. |
| 2016/0297479 A1 | 10/2016 | Ritschel et al. |
| 2016/0346997 A1 | 12/2016 | Lewis |
| 2017/0057558 A1 | 3/2017 | Hillebrecht et al. |
| 2017/0080673 A1 | 3/2017 | Schaedler |
| 2017/0113344 A1 | 4/2017 | Schonberg |
| 2017/0341309 A1 | 11/2017 | Piepenbrock et al. |

FOREIGN PATENT DOCUMENTS

| | | |
|---|---|---|
| CN | 1590185 A | 3/2005 |
| CN | 201400267 Y | 2/2010 |
| CN | 201484210 U | 5/2010 |
| CN | 103341625 A | 10/2013 |
| CN | 103465363 A | 12/2013 |
| CN | 103895717 | 7/2014 |
| CN | 203887169 U | 10/2014 |
| CN | 104590397 A | 5/2015 |
| CN | 105501299 A | 4/2016 |
| CN | 207072403 U | 3/2018 |
| DE | 4423642 C1 | 10/1995 |
| DE | 19929057 A1 | 12/2000 |
| DE | 10309631 A1 | 9/2004 |
| DE | 102010033289 A1 | 2/2012 |
| DE | 201620105052 U1 | 4/2017 |
| EP | 0230611 A2 | 8/1987 |
| EP | 3450358 A1 | 10/1991 |
| EP | 3135566 A1 | 8/2015 |
| FR | 940982 A | 12/1948 |
| FR | 2941166 A1 | 7/2010 |
| GB | 2335669 A | 9/1999 |
| JP | 2004216425 A | 8/2004 |
| JP | 2011213312 A | 10/2011 |
| KR | 20160056634 A | 5/2016 |
| WO | 96/36455 A1 | 11/1996 |
| WO | 96/36525 A1 | 11/1996 |
| WO | 96/38260 A1 | 12/1996 |
| WO | 99/49150 A1 | 9/1999 |
| WO | 0129143 A1 | 4/2001 |
| WO | 02090146 A2 | 11/2002 |
| WO | 2003024641 A1 | 3/2003 |
| WO | 2004108343 A1 | 12/2004 |
| WO | 2005093773 A1 | 10/2005 |
| WO | 2007003375 A1 | 1/2007 |
| WO | 2007110235 A1 | 10/2007 |
| WO | 2007110236 A1 | 10/2007 |
| WO | 2008019847 A1 | 2/2008 |
| WO | 2007128586 A3 | 6/2008 |
| WO | 2008068314 A2 | 6/2008 |
| WO | 2008086994 A1 | 7/2008 |
| WO | 2008087024 A1 | 7/2008 |
| WO | 2008107130 A1 | 9/2008 |
| WO | 2008138503 A1 | 11/2008 |
| WO | 2008145396 A1 | 12/2008 |
| WO | 2009083609 A2 | 7/2009 |
| WO | 2009098285 A1 | 8/2009 |
| WO | 2009112520 A1 | 9/2009 |
| WO | 2009135938 A1 | 11/2009 |
| WO | 2009140977 A1 | 11/2009 |
| WO | 2010125057 A2 | 11/2010 |
| WO | 2010125058 A1 | 11/2010 |
| WO | 2010142703 A2 | 12/2010 |
| WO | 2011032533 A1 | 3/2011 |
| WO | 2012166505 A1 | 12/2012 |
| WO | 2014016437 A1 | 1/2014 |
| WO | 2014028169 A2 | 2/2014 |
| WO | 2014187720 A1 | 11/2014 |
| WO | 2014195340 A1 | 12/2014 |
| WO | 2015089315 A1 | 6/2015 |
| WO | 2015118268 A1 | 8/2015 |
| WO | 2015175892 A1 | 11/2015 |
| WO | 2015193331 A1 | 12/2015 |
| WO | 2016116414 A1 | 7/2016 |
| WO | 2017036461 A1 | 3/2017 |
| WO | 2019030248 A1 | 2/2019 |
| WO | 2019042504 A1 | 3/2019 |
| WO | 2019048010 A1 | 3/2019 |
| WO | 2019048498 A1 | 3/2019 |
| WO | 2019048680 A1 | 3/2019 |
| WO | 2019048682 A1 | 3/2019 |

OTHER PUBLICATIONS

US 9,809,265 B2, 11/2017, Kinjo (withdrawn)
US 10,449,880 B2, 10/2019, Mizobata et al. (withdrawn)
First Office Action dated Aug. 10, 2018, regarding China Application No. CN201580047291.2.
Altair Optistruct Revolutionizes Lattice Structures for 3D Printing; Feb. 26, 2015 (Year 2015), www.altair.com/(X(1)S(zwygunynpzj1mvuglgxh4s1u))/Default.aspx?AspxAutoDetectCookieSupport=1).
Australian Examination Report No. 2 dated Mar. 15, 2019, regarding AU2015284265.
Singapore First Written Opinion dated Mar. 6, 2019, regarding Application No. SG10201806531Q.
Nickel, L., "3D Printing the World's First Metal Bicycle Frame," Metal Powder Report, Apr. 30, 2014, vol. 69, No. 2, pp. 38-40.
Anonymous: "Lightweight Bike Stem using metal Additive Manufacturing", Feb. 10, 2012 (Feb. 10, 2012), XP055442489, Retrieved from the Internet: URL:https://www.3trpd.co.uk/portfolio/lightweight-bike-stem-using-metal-am/gallery/c onsumer-goods-case-studies/ [retrieved on Jan. 19, 2018], the whole document.
Jey Won et al: "Rapid prototyping of robotic systems", Proceedings of The 2000 IEEE International Conference on Robotics and Automation. ICRA 2000. San Francisco, CA, Apr. 24-28, 2000; [Proceedings of The IEEE International Conference on Robotics and Automation], New York, NY : IEEE, US, Apr. 24, 2000 (Apr. 24, 2000), pp. 3077-3082, XP002233177, ISBN: 978-0-7803-5887-4, p. 1, col. 2; figures 1-7.
International Search Report and Written Opinion dated Nov. 21, 2016, regarding PCT/U82016/049796.
Shury, John: "This 3D Printed Carbon Fibre Car Wants to Reinvent Manufacturing", In Composites Today [online], Jul. 16, 2015 [retrieved on Oct. 21, 2016], retrieved from the internet: <URL: http://www.compositestoday.com/2015/07/ths-3d-printed-carbon-fibre-car-wants-to-reinvent-manufacturing/>, see the entire document.
Carbon fiber race car technology hits the streets. Published online Jul. 1, 2005. Accessed Oct. 5, 2015. http://www.compositesworld.com/articles/carbon-fiber-race-car-technology-hits-the-streets.
Chalcraft; E., "Road-ready 3D-printed car on the way. Published Mar. 7, 2013; Accessed Jul. 8, 2015. http://www.dezeen.conn/2013/03/07/road-ready-3d-printed-car-on-the-way/".
George; A., "The Germans Have Figured Out How to 3-D Print Cars. Published Mar. 19, 2014; Accessed Jul. 8, 2015. http://www.wired.com/2014/03/edag-3-d-printed-carp".
3D Printing Transforms The Automotive Industry. Published 01/2012016; Accessed Dec. 27, 2016. https://www.sculpteo.com/blog/2016/01/20/3d-printing-transforms-the-automotive-industry.
Design Democracy: Drones Meet 3D Printed Cars For A Self-Driven Future. Published Nov. 9, 2016; Accessed Dec. 27, 2016. https://3dprintingindustry.com/news/design-democracy-drones-meet-3d-printed-cars-self-driven-future-98125/.
LM3D Home Page. Published 2015; Accessed 12/2712016. https://localmotors.com/3d-printed-car/.
Stratasys Automotive Website, Published 2016, Accessed Dec. 27, 2016; http://www.stratasys.com/industries/automotive.
Architecture>Grasshopper (online). Andrea Springer, 2013. Accessed Oct. 21, 2015, retrieved from the internet: http://www.andreaspringerstudio.com/architecture/grasshopper/.
Coldewey, D.,Fine Ride: World's First 3-D Printed Bike Frame Weighs Just 3 Pounds, Published Feb. 14, 2014; Accessed Jul. 8, 2015. http://www.nbcnews.com/tech/innovation/fine-ride-worlds-first-3-d-printed-bike-frame-weighs-n30761.
Flying Machine Website, 3D Printed Titanium: Bike of the Future, Accessed Jul. 8, 2015: http://www.flyingmachine.com/au/3d-printed-titanium-bike-of-the-future/.
International search report and written opinion dated Aug. 24, 2015 for PCT Application No. US2015/030996.

(56) References Cited

OTHER PUBLICATIONS

International search report and written opinion dated Sep. 20, 2016 for PCT Application No. PCT/US2016/035893.
International search report and written opinion dated Oct. 6, 2015 for PCT Application No. US2015/038449.
Androole.,Custom 3D Printed Carbon Fiber Bike Frame, Accessed Jul. 8, 2015: http://www.instructables.com/id/Custom-3D-Printed-Carbon-Fiber-Bike-Frame/.
International Search Report and Written Opinion dated Nov. 21, 2016, regarding PCT/US2016/049796.
Singapore Examination Report dated Jan. 24, 2019, regarding Singapore Application No. 11201610967R.
George, A., "3-D Printed Car is as Strong as Steel, Half the Weight, and Nearing Production," Published Feb. 27, 2013; Accessed Jul. 8, 2015, http/www.wired.com/2013/02/3d-printedcar/.
3D Prints of the World Website, Accessed Jul. 8, 2015, http://3dprintsoftheworld.com/object/viz-1-tack-bike-frame-3d-printed-lugs.
Written Opinion dated Mar. 8, 2018, regarding Singapore Application No. 11201610967.
Tube Defined: https://www.dictionary.com/browse/tube (Year: 2018).
Medial axis tree—an internal supporting structure for 3D printing, Mar. 25, 2015: https://www.sciencedirect.com/science.com/science/article/pii/ S0167839615000357 (Year: 2015).
The investigation of a method to generate conformal lattice structures; Nov. 17, 2011; https://dspace.lboro.ac.uk/dspace-jspui/bitstream/ 2134/9146/1/Thesis-2011-Craddock.pdf (Year: 2011).
Intratattice: Aug. 31, 2015; http://www.intralatticepro.com/documentation/userdocsV8 (Year; 2015).
Design and Optimization of Lattice Structures: Jun. 23, 2015; https://insider.altairhyperworks.com/design-and-optimization-of-lattice-structures-for-3d-printing-using-altair-eptistruct/ (Year: 2015).
Supplementary European Search Report and Search Opinion dated Apr. 5, 2019 regarding EP16842953.8.
Written Opinion dated May 3, 2019, regarding Singapore Application No. SG11201801033P.
Notice of Reasons for Rejection received in Japanese Patent Application No. 2018-510710, dated May 12, 2020.
Examination Report No. 1 received in Australian Patent Application No. 2016315829, dated Apr. 22, 2020.
Decision of Rejection received in Japanese Patent Application No. 2017-521019, dated Apr. 27, 2020.
Notice of Reasons for Rejection dated Jun. 3, 2019, regarding Japanese Application No. JP2017-0521019.
Examination Report No. 3 for Standard Patent Application received in Australian Patent Application No. 2015284265, dated Mar. 11, 2020.
Second Written Opinion received in Singapore Application No. 11201801033P, dated Mar. 2, 2020.
Crolla "Automotive Engineering—Powertrain, Chassis System and Vehicle Body", Section 15—Vehicle Modeling, Section 16—Structural Design, Section 17—Vehicle Safety, Jul. 30, 2009.
Notice of Reasons for Rejection received in Japanese Patent Application No. 2019-218476, dated Mar. 9, 2020.
Shury, "This 3D Printed Carbon Fibre Car Wants to Reinvent Manufacturing", https://www.compositestoday.com/2015/07/this-3d-printed-carbon-fibre-car-wants-to-reinvent-manufacturing, dated Jul. 16, 2015.
Notification of the First Office Action received in Chinese Patent Application No. 201680062251.X, dated Feb. 3, 2020, with English Translation.
Examination Report received in Sigapore Application No. 10201806531Q, dated Dec. 30, 2019.
Communication pursuant to Article 94(3) received in European Patent Application No. 15815934.3, dated Jul. 23, 2020.
Office Action received in Patent Application in Brazil No. BR 112018003879-2 dated Jul. 12, 2020.
Office Action received in Patent Application in Mexico No. MX/a/2017/000061 dated Jul. 7, 2020.
Communication Pursuant to Article 94(3) EPC Application No. 16 842 953.8-1009 dated Oct. 1, 2020.

\* cited by examiner

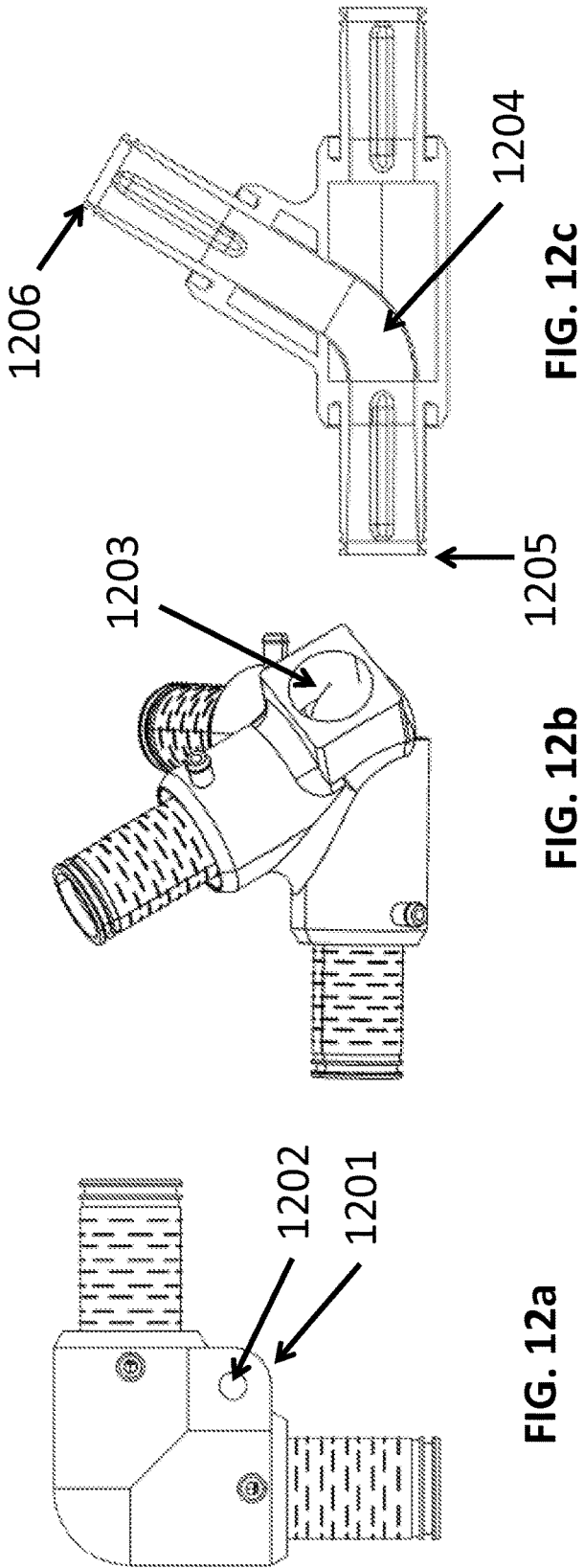

STRESS-BASED METHOD FOR OPTIMIZATION OF JOINT MEMBERS WITHIN A COMPLEX STRUCTURE

CROSS-REFERENCE TO RELATED APPLICATIONS

This application is a divisional of, and claims priority to, U.S. Non-Provisional patent application Ser. No. 14/788,154, filed Jun. 30, 2015, entitled "Systems And Methods For Fabricating Joint Members," now pending, which claims priority to U.S. Provisional Patent Application Ser. No. 62/020,084 filed Jul. 2, 2014, entitled "Systems And Methods For Fabricating Joint Members,", both of which are entirely incorporated herein by reference.

BACKGROUND

Space frame construction is used in automotive, structural, marine, and many other applications. One example of space frame construction can be a welded tube frame chassis construction, often used in low volume and high performance vehicle design due to the advantages of low tooling costs, design flexibility, and the ability to produce high efficiency structures. These structures require that tubes of the chassis be connected at a wide variety of angles and may require the same connection point to accommodate a variety of tube geometries. Traditional methods fabrication of joint members for connection of such tube frame chassis may incur high equipment and manufacturing costs.

SUMMARY

A need exists for a fabrication method which may be able to generate joints to connect tubes with a variety of geometric parameters. Provided herein is a method of 3-D printing joints for the connection of tubes, such as carbon fiber tubes. The joints may be printed according to the specification of geometric and physical requirements at each tube intersection point. The method of 3-D printing the joints may reduce manufacturing costs and may be easily scaled.

The 3-D printing method described in this disclosure may allow for the printing of fine features on the joints that may not be achievable through other fabrication methods. An example of a fine feature described in this disclosure may be centering features to force the center of a connecting tube and the center of an adjoining joint protrusion to be co-axial. The centering features may provide a gap between an outer surface of inner region of a joint and an inner surface of a connecting tube, through which adhesive may be applied. Another example may be that nipples can be printed on the joint which may connect to equipment to introduce adhesive to bind a joint and tube assembly.

Aspects of the invention are directed to a method of fabricating a joint member for connection of a plurality of connecting tubes forming a space frame, the method comprising: determining a relative tube angle, tube size, and tube shape for each of the plurality of connecting tubes to be connected by the joint member; determining a stress direction and magnitude to be exerted by the plurality of connecting tubes at the joint member; and 3-D printing the joint member having a configuration that (1) accommodates the relative tube, angle, tube size, and tube shape at each joint member, and (2) supports the stress direction and magnitude exerted by the plurality of connecting tubes.

In some embodiments, the space frame is configured to at least partially encloses a three-dimensional volume. Each connecting tube of the plurality of connecting tubes may have a longitudinal axis along a different plane. The space frame may be a vehicle chassis frame.

The method may further comprise 3-D printing centering features on at least a portion of the joint member. The centering features may be printed on a joint protrusion of the joint member configured to be inserted into a connecting tube. The characteristics of the centering features can be determined based on the stress direction and magnitude to be exerted by the plurality of connecting tubes at the joint member. The stress direction and magnitude to be exerted by the plurality of connecting tubes at the joint member may be determined empirically or computationally.

An additional aspect of the invention may be directed to a vehicle chassis comprising: a plurality of connecting tubes; and a plurality of joint members, each joint member sized and shaped to mate with at least a subset of the plurality of the connecting tubes in the plurality of connecting tubes to form a three-dimensional frame structure, wherein the plurality of joint members are formed by a 3-D printer.

In some embodiments, each joint member of the plurality of joint members is sized and shaped such that the joint member contacts an inner surface and an outer surface of a connecting tube when the connecting tube is mated to the joint member. Optionally, at least one joint member of the plurality of joint members comprises internal routing features formed during 3-D printing of the joint member. The internal routing features may provide a network of passageways for transport of fluid through the vehicle chassis when the three-dimensional frame structure is formed. The internal routing features may provide a network of passageways for transport of electricity through electrical components throughout the vehicle chassis when the three-dimensional frame structure is formed.

The plurality of joint members may comprise mounting features formed during 3-D printing of the joint members. The mounting features may provide panel mounts for mounting of panels on the three-dimensional frame structure.

A system for forming a structure may be provided in accordance with an additional aspect of the invention. The system may comprise: a computer system that receives input data that describes a relative tube angle, tube size, and tube shape for each of a plurality of connecting tubes to be connected by a plurality of joint members to form a frame of the structure, wherein the computer system is programmed to determine a stress direction and magnitude to be exerted by the plurality of connecting tubes at the plurality of joint members: and a 3-D printer in communication with the computer system configured to generate the plurality of joint members having a size and shape that (1) accommodates the relative tube, angle, tube size, and tube shape at each joint member, and (2) supports the stress direction and magnitude exerted by the plurality of connecting tubes.

In some cases, the frame of the structure at least partially encloses a three-dimensional volume. The plurality of joint members may further comprise centering features on at least a portion of the joint member formed by the 3-D printer. The centering features may be printed on a joint protrusion of the joint member configured to be inserted into a connecting tube. The characteristics of the centering features may be determined based on the stress direction and magnitude to be exerted by the plurality of connecting tubes at each joint member.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "figure" and "FIG." herein), of which:

FIG. 12a-c show joints printed with integrated structural features and passageways for electrical and fluid routing.

DETAILED DESCRIPTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

This disclosure provides a method to fabricate a joint member by additive and/or subtractive manufacturing, such as 3-D printing. The joint member may be configured to provide a connection of a plurality of connecting tubes, which may be used for the construction of a lightweight space frame. A space frame can be a frame that has a three-dimensional volume. A space frame can be a frame that can accept one or more panels to at least partially enclose the frame. An example of a space frame may be a vehicle chassis. Various aspects of the described disclosure may be applied to any of the applications identified here in addition to any other structures comprising a joint/tube frame construction. It shall be understood that different aspects of the invention may be appreciated individually, collectively, or in combination with each other.

Figure 1:
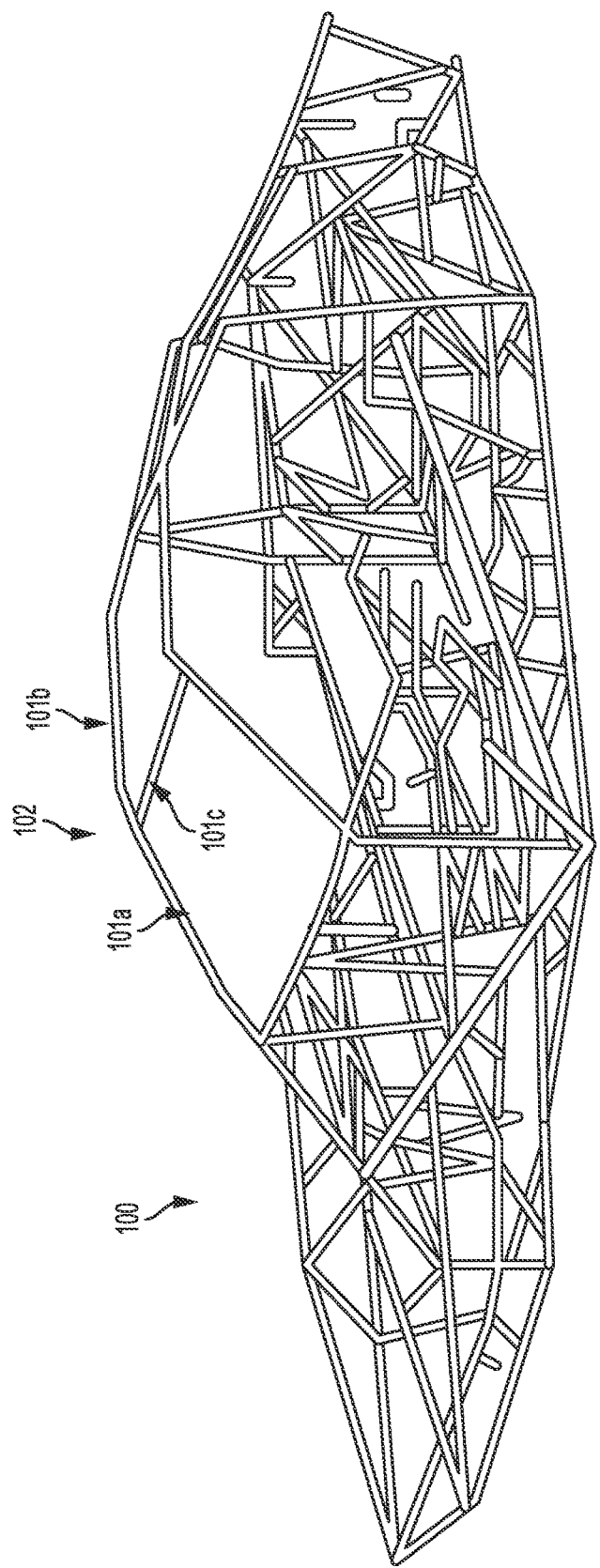
FIG. 1 shows an example of a space frame chassis constructed from carbon fiber tubes connected by 3-D printed nodes.

FIG. 1 shows a vehicle chassis 100 including connecting tubes 101a, 101b, 101c connected by one or more nodes (a.k.a. joints) 102, in accordance with an embodiment of the invention. Each joint member can comprise a central body and one or more ports that extent from the central body. A multi-port node, or joint member, may be provided to connect tubes, such as carbon fiber tubes, to form a two or three-dimensional structure. The structure may be a frame. In one example, a two dimensional structure may be a planar frame, while a three dimensional structure may be space frame. A space frame may enclose a volume therein. In some examples, a three dimensional space frame structure may be a vehicle chassis. The vehicle chassis may be have a length, width, and height that may enclose a space therein. The length, width, and height of the vehicle chassis may be greater than a thickness of a connecting tube.

A vehicle chassis may form the framework of a vehicle. A vehicle chassis may provide the structure for placement of body panels of a vehicle, where body panels may be door panels, roof panels, floor panels, or any other panels forming the vehicle enclosure. Furthermore the chassis may be the structural support for the wheels, drive train, engine block, electrical components, heating and cooling systems, seats, or storage space. A vehicle may be a passenger vehicle capable of carrying at least about 1 or more, 2 or more, 3 or more, 4 or more, 5 or more, 6 or more, 7 or more, 8 or more, ten or more, twenty or more, or thirty or more passengers. Examples of vehicles may include, but are not limited to sedans, trucks, buses, vans, minivans, station wagons, RVs, trailers, tractors, go-carts, automobiles, trains, or motorcycles, boats, spacecraft, or airplanes. The vehicle chassis may provide a form factor that matches the form factor of the type of vehicle. Depending on the type of vehicle, the vehicle chassis may have varying configurations. The vehicle chassis may have varying levels of complexity. In some instances, a three-dimensional space frame may be provided that may provide an outer framework for the vehicle. The outer framework may be configured to accept body panels to form a three-dimensional enclosure. Optionally, inner supports or components may be provided. The inner supports or components can be connected to the space frame through connection to the one or more joint members of the space frame. Different layouts of multi-port nodes and connecting tubes may be provided to accommodate different vehicle chassis configurations. In some cases, a set of nodes can be arranged to form a single unique chassis design. Alternatively at least a subset of the set of nodes can be used to form a plurality of chassis designs. In some cases at least a subset of nodes in a set of nodes can be assembled into a first chassis design and then disassembled and reused to form a second chassis design. The first chassis design and the second chassis design can be the same or they can be different. Nodes may be able to support tubes in a two or three-dimensional plane. For example, a multi-prong node may be configured to connect tubes that do not all fall within the same plane. The tubes connected to a multi-prong node may be provided in a three-dimensional fashion and may span three orthogonal axes. In alternate embodiments, some nodes may connect tubes that may share a two-dimensional plane. In some cases, the joint member can be configured to connect two or more tubes wherein each tube in the two or more tubes has a longitudinal axis along a different plane. The different planes can be intersection planes.

The connecting tubes 101a, 101b, 101c of the vehicle may be formed from a carbon fiber material, or any other available composite material. Examples of composite materials may include high modulus carbon fiber composite, high strength carbon fiber composite, plain weave carbon fiber composite, harness satin weave carbon composite, low modulus carbon fiber composite, or low strength carbon fiber composite. In alternate embodiments, the tubes may be formed from other materials, such as plastics, polymers, metals, or metal alloys. The connecting tubes may be formed from rigid materials. The connecting tubes may have varying dimensions. For example, different connecting tubes may have different lengths. For example, the connecting tubes may have lengths on the order of about 1 inch, 3 inches, 6 inches, 9 inches, 1 ft, 2 ft, 3 ft, 4 ft, 5 ft, 6 ft, 7 ft, 8 ft, 9 ft, 10 ft, 11 ft, 12 ft, 13 ft, 14 ft, 15 ft, 20 ft, 25 ft, or 30 ft. In some instances, the tubes may have the same diameter, or varying diameters. In some instances, the tubes may have diameters on the order of about $\frac{1}{16}"$, $\frac{1}{8}"$, $\frac{1}{4}"$, $\frac{1}{2}"$, 1", 2", 3", 4", 5", 10", 15", or 20".

The connecting tubes may have any cross-sectional shape. For example, the connecting tubes may have a substantially circular shape, square shape, oval shape, hexagonal shape, or any irregular shape. The connecting tube cross-section could be an open cross section, such as a C-channel, I-beam, or angle.

The connecting tubes 101a, 101b, 101c may be hollow tubes. A hollow portion may be provided along the entire length of the tube. For example, the connecting tubes may have an inner surface and an outer surface. An inner diameter for the tube may correspond to an inner surface of the connecting tube. An outer diameter of the tube may correspond to an outer diameter of the tube. In some embodiments, the difference between the inner diameter and the outer diameter may be less than or equal to about $\frac{1}{32}"$, $\frac{1}{16}"$, $\frac{1}{8}"$, $\frac{1}{4}"$, $\frac{1}{2}"$, 1", 2", 3", 4, or 5". A connecting tube may have two ends. The two ends may be opposing one another. In alternative embodiments, the connecting tubes may have three, four, five, six or more ends. The vehicle chassis frame may comprise carbon fiber tubes connected with nodes 102.

The multi-port nodes 102 (a.k.a. joints, joint members, joints, connectors, lugs) presented in this disclosure may be suitable for use in a vehicle chassis frame such as the frame shown in FIG. 1. The nodes in the chassis frame 100 may be designed to fit the tube angles dictated by the chassis design. The nodes may be pre-formed to desired geometries to permit rapid and low cost assembly of the chassis. In some embodiments the nodes may be pre-formed using 3-D printing techniques. 3-D printing may permit the nodes to be formed in a wide array of geometries that may accommodate different frame configurations. 3-D printing may permit the nodes to be formed based on a computer generated design file that comprises dimensions of the nodes.

A node may be composed of a metallic material (e.g. aluminum, titanium, or stainless steel, brass, copper, chromoly steel, or iron), a composite material (e.g. carbon fiber), a polymeric material (e.g. plastic), or some combination of these materials. The node can be formed from a powder material. The 3-D printer can melt and/or sinter at least a portion of the powder material to form the node. The node may be formed of a substantially rigid material.

A node may support stress applied at or near the node. The node may support compression, tension, torsion, shear stresses or some combination of these stress types. The magnitude of the supported stress at the node may be at least 1 Mega Pascal (MPa), 5 MPa, 10 MPa, 20 MPa, 30 MPa, 40 MPa, 50 MPa, 60 MPa, 70 MPa, 80 MPa, 90 MPa, 100 MPa, 250 MPa, 500 MPa, or 1 GPa. The type, direction, and magnitude of stress may be static and dependent on the location of the node in a frame. Alternately the stress type, direction, and magnitude may be dynamic and a function of the movement of the vehicle, for example the stress on the node may change as the vehicle climbs and descends a hill.

Figure 2:
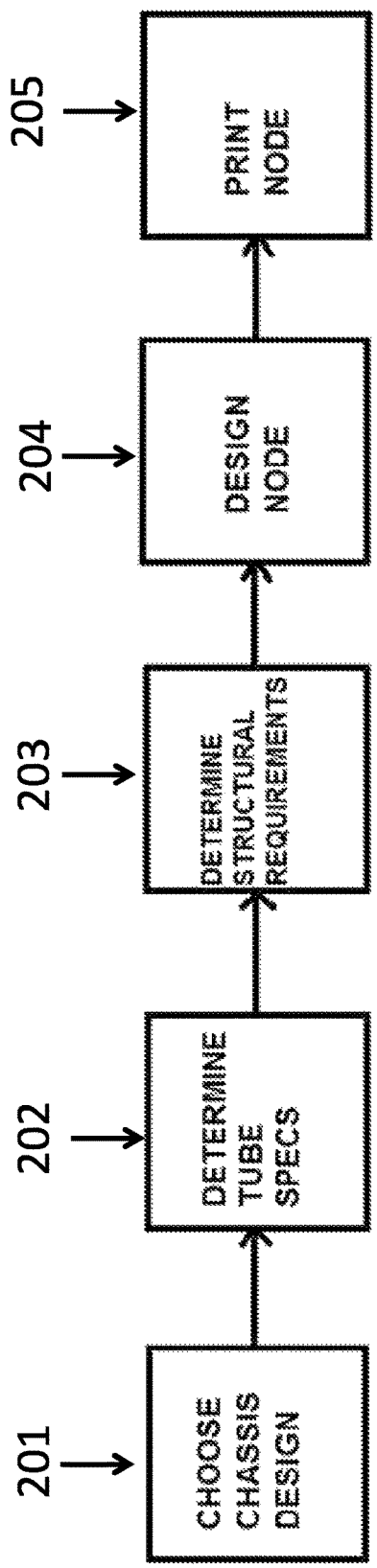
FIG. 2 shows a flow chart of the process used to design and build joints.

FIG. 2 shows a flow chart describing a method for 3-D printing joint members for connecting tubes, such as carbon fiber tubes, in a space frame. In this method a chassis design model is chosen 201. The chassis design model may be a new design or a design stored in a library which may comprise previously used designs or common stock designs. The chassis design can be generated by a user that forms the joints with the 3-D printing process or by a user that is different from the user that forms the joints. The chassis design can be editable. The chassis design can be made available through an online marketplace. From the chosen chassis design the tube specification (e.g. inner and outer diameter, tube cross section, and angle of tubes relative to each other at connection points) are determined 202. Next the dynamic and static stresses at each tube connection point are determined 203. The dynamic and static stresses at each tube connection point can be determined using a computational model, for example a finite element analysis. Using the physical and structural properties determined in steps 202 and 203 the joint (node) is designed 204. Finally in the last step the joints are generated using a 3-D printer according to the specification determined by the earlier steps 205. Two or more joints can be formed simultaneously. Alternatively joints can be formed one at a time.

A chassis design model may be generated in any available structural design software program, for example AutoCAD, Autodesk, Solid Works, or Solid Edge. The chassis design model may be generated in a simple, custom design tool tailored to the requirements of space frame design. This customized tool could interface to existing structural design software to automatically generate complete node geometries from a minimal set of input data (e.g. relative angles of tubes entering a given node). After generating a model of the chassis each tube connection point may be defined. Tube connection points may be locations where a joint is used to connect two or more tubes. Characteristics of the tube connection points may be determined by the model and used to define the joint structure needed for the design, for example the number of tubes, tube dimensions, and relative angles of tubes may be determined. The number of tubes at each joint may be determined from the chassis model, for example a joint may connect 2, 3, 4, 5, 6, 7, 8, 9, or 10 tubes. The diameter and cross sectional shape of each connecting tube at a joint location may be determined from the model. For example a joint may connect a square tube, round tube, oval tube, triangular tube, pentagonal tube, hexagonal tube, or an irregularly shaped tube. The tubes connected to the joint may all have the same cross section shape or they may vary. The diameter of the connecting tube may be determined from the model, a connecting tube may have a diameter of at least about 1/16", 1/8", 1/4", 1/2", 1", 2", 3", 4", 5", 10", 15", or 20". The tubes connected to the joint may all have the same diameter or the diameter may vary. The relative angles of the tubes at each joint may also be determined from the chassis model.

Optionally, a user may design a portion of the chassis design or provide specifications for the design to comply with. The software executed by one or more processors may design the rest of the chassis or provide details for the chassis in compliance with the specification. The processor may generate at least a portion of the design without requiring any further human intervention. Any of the features described herein may be initially designed by the software, a user, or both the software and the user.

Locations of additional structural, mechanical, electrical, and fluid components may also be determined from the structural design software. For example the location of shear panels, structural panels, shock systems, engine block, electrical circuits, and fluid passageways may be determined by structural design software. The chassis model may be used to define the joint design such that the joints can integrate with locations of the structural, mechanical, electrical, and fluid components.

The chassis model may be used to calculate stress direction and magnitude at each joint. The stress may be calculated using a finite element analysis employing a linear or non-linear stress model. Stress may be calculated on the joints while the chassis is stationary or while the chassis is moving along a typical path, for example, along a straight line, curved trajectory, along a smooth surface, along a rugged surface, flat terrain, or hilly terrain. The calculated stress on the joint may be shear, tensile, compressive, torsional stress, or a combination of stress types. Joints may include design features to support the calculated stresses. The design features included on the joint may be configured to comply with a specific safety standard. For example the joint may be configured to withstand the calculated stress within a factor of safety of at least 1, 2, 3, 4, 5, 10, 15, 20, 25, 30, 35, 40, 45, or 50. Joints may be designed to support tubes over a frame that may vibrate or undergo shock or impact. For example, a vehicle chassis may be driven over a road, and may experience long-term vibrations. The joints may be able to withstand the forces and stresses exerted on the joint caused by the vibrations over a long period of time. In another example, a vehicle may experience an impact if the vehicle were to hit another object. The joints may be designed to withstand the impact. In some instances, the joints may be designed to withstand the impact up to a certain predetermined degree. Optionally, it may be desirable to for the joints to deform or alter their configuration beyond the predetermined degree and absorb shock. The joints may be designed to meet various frame specifications and criteria. In some cases, the joints may be designed to form a chassis that meets state or national safety requirements for consumer and/or commercial vehicles.

Figure 3:
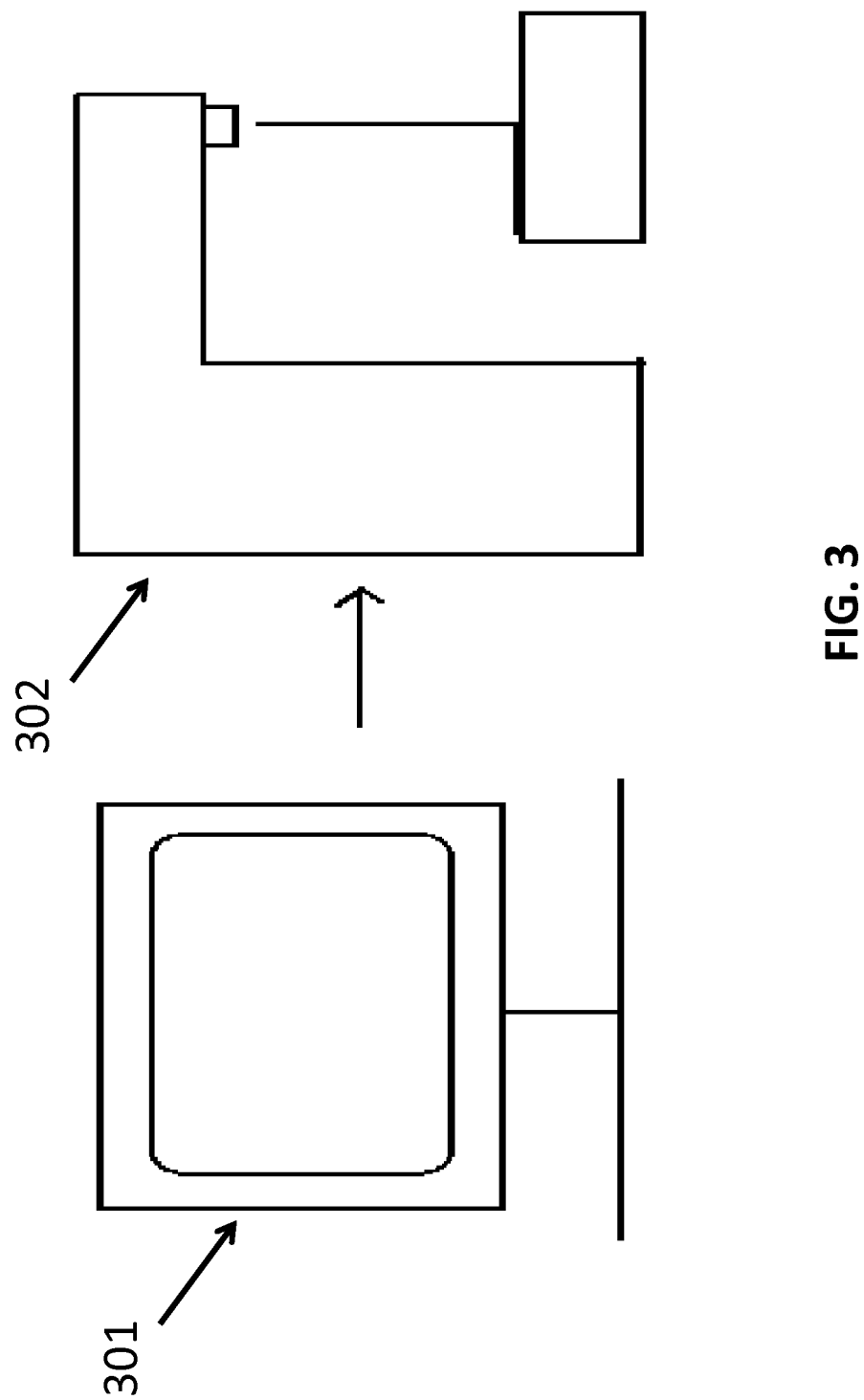
FIG. 3 shows a computer in communication with a 3-D printer.

The final joint design may be determined by the tube dimension and shape requirements, location of integrated structural, mechanical, electrical, and fluid components, and the calculated stress type and magnitude, along with any performance specifications. FIG. 3 shows a diagram of how a computational model of a joint meeting the necessary specifications may be developed in a software program on a device 301. The device may comprise a processor and/or a memory. The memory may comprise non-transitory computer readable media comprising code, logic, or instructions for performing one or more steps, such as the design steps or computations. The processor may be configured to perform the steps in accordance with the non-transitory computer readable media. The device may be a desktop computer, cell, smartphone, tablet, laptop, server, or any other type of computational device. The device may be in communication with a 3-D printer 302. The 3-D printer 302 may print the joint according to the design developed in the software program. The 3-D printer can be configured to generate an object through additive and/or subtractive manufacturing. The 3-D printer can be configured to form a metallic, composite, or polymer object. The 3-D printer may be a direct metal laser sintering (DMLS) printer, electron beam melting (EBM) printer, fused deposition modeling (FDM) printer, or a Polyjet printer. The 3-D printer may print joints made of titanium, aluminum, stainless steel, structural plastics, or any other structural material.

3-D printing may comprise a process of making a 3-dimensional structure based on a computational or electronic model as an input. The 3-D printer may employ any known printing technique including extrusion deposition, granular binding, lamination, or stereolithography. The general technique of 3-D printing may involve breaking down the design of the 3-dimensional object into a series of digital layers which the printer will then form layer by layer until the object is completed. Joints may be printed in a layer by layer fashion, and may accommodate a wide range of geometric designs and detailed features, which may include internal and external features.

The 3-D printed joints may be assembled with the tubes to form a frame structure. The design may be flexible to accommodate late design changes. For example if a support tube is added to the design late in the design process, additional joints can be printed quickly and at low cost to accommodate the additional support tube. The method of using a computer model in communication with a 3-D printer to generate joints may allow for a wide range of geometries to be produced quickly at low cost.

Figure 4:
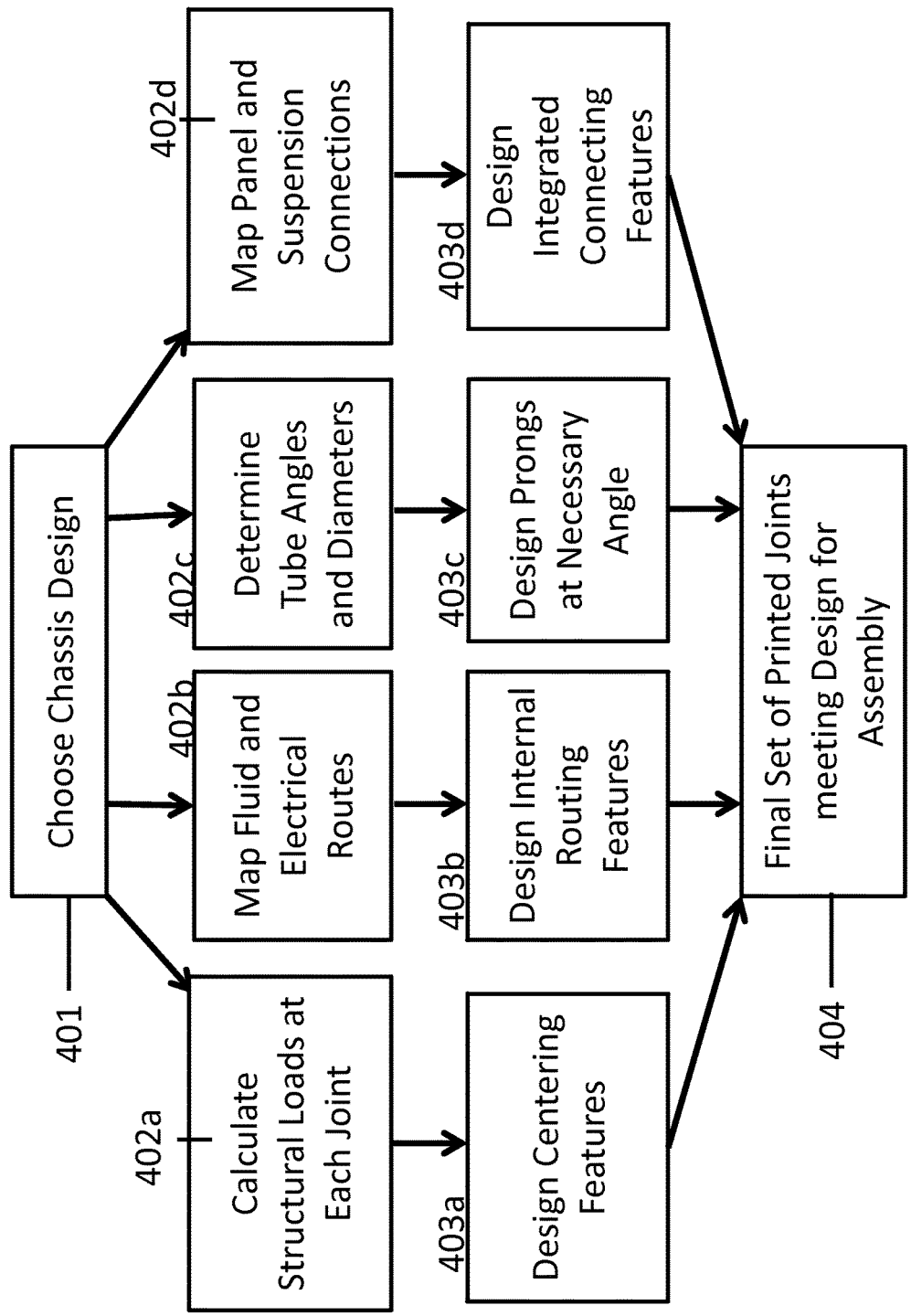
FIG. 4 shows a detailed flow chart describing how a design model may be used to generate printed joints for assembly of the given design model.

FIG. 4 shows a detailed flow chart of the method previously described. The steps described are provided by way of example only. Some steps may be omitted, completed out of order, or swapped out with other steps. Any of the steps may be performed automatically with aid of one or more processors. The one or more steps may or may not be performed with user input of intervention. The process begins with step 401, which involves choosing a frame design, such as a chassis design, the design may be chosen from a library of stored designs or it may be a new design developed for a specific project.

After the design is chosen the next steps are 402a, 402b, 402c, and/or 402d, which may include calculating structural needs or specifications for the joints of the frame. Steps 402a-d may be completed in any order, all steps 402a-d may be completed or only some of the steps may occur. Step 402a involves calculating the structural load at each joint. The structural load may be determined by a finite element method and may include the direction and magnitude of shear stresses, compressive stresses, tension stresses, torsional stress, or any combination of stresses. The stresses may be calculated assuming that the vehicle is in motion or assuming the vehicle is stationary. This may also include calculating any performance specifications, such as safety, manufacturing, durability specifications. Step 402b is to map the fluid and electrical routes throughout the vehicle. Examples of fluid passageways may include coolant, lubrication, ventilation, air conditioning, and/or heating ducts. Examples of electrical system that may require electrical routing from a source to a system may include audio systems, interior lighting systems, exterior lighting systems, engine ignition components, on board navigation systems, and control systems. Step 402c is the determination of the tube angle, shape, and size at each joint. In step 402d the structural components such as panel and suspension connections are mapped.

Following the calculation of the joint needs/specifications in steps 402a-d the joint member may be designed to accommodate the joint needs/specifications in steps 403a-d. The joint design method may comprise steps 403a-d. Steps 403a-d may be completed in any order, all steps 403a-d may be completed or only some of the steps may occur. The known stress profile at each joint may determine the wall thickness of the joint, the joint material, or necessary centering features to print on the joint 403a. After the fluid and electrical routes are mapped corresponding internal routing features may be designed to be printed on the joints 403b. The joint may have separate internal routing features for the fluid and electrical pathways or the joint may have one routing feature shared by fluid and electrical passageways. After determining the tube angle, shape, and size the joint may be designed 403c such that it can accommodate the necessary tubes while meeting the other specifications. Using the map determined in 402d, the locations of integrated connecting features are designed to be printed on the joints 403d. Such design steps may occur in sequence or in parallel. The various joint design needs may be considered in combination when designing the joint for printing. In some instances, the 3-D printing process may also be considered in designing the joint.

In the final step 404 a set of printed joints are produced for used in the frame assembly chosen in 401. The printed joints may be 3-D printed in compliance with the joint designed using the collective considerations of steps 403a-d. The printed joints may be used to complete the assembly of the chassis.

The 3-D printing method described herein adapted to fabricate joints for connecting tubes may decrease the time required to assemble a chassis. For example the total time to design and build a chassis may be less than or equal to about 15 min, 30 min, 45 min, 1 hour, 2 hours, 3 hours, 4 hours, 5 hours, 6 hours, 7, hours, 8 hours, 9 hours, 10 hours, 12 hours, 1 day, 2 days, 3 days, 4 days, 5 days, 6 days, 1 week, 2 weeks, 3 weeks, 4 weeks, or 1 month. In some instances, the printing of a joint itself may take less than or equal to about 1 min, 3 min, 5 min, 10 min, 15 min, 20 min, 30 min, 40 min, 50 min, 1 hour, 1.5 hours, 2 hours, 2.5 hours, or 3 hours. The time required to assemble a chassis may be reduced because the 3-D printing method may require fewer tools than a typical manufacturing method. In the method described herein, a single tool (e.g. 3-D printer) may be configured to fabricate a plurality of joints with different specifications (e.g., sizes/shapes). For example, a series of joints may be printed using a single 3-D printer that all have the same design. In another example, a series of joints may be printed using a single 3-D printer, the series of joints having different designs. The different designs may all belong to the same frame assembly, or may be printed for different frame assemblies. This may provide a higher degree of flexibility in scheduling joint print jobs at a site, and may permit a manufacturer to optimize production of joints to meet specified goals. In some cases, the 3-D printer can be sized and shaped such that it can be transported to a site where a vehicle is being built. Furthermore, 3-D printing may increase quality control or consistency of joints.

The manufacturing process described by FIG. 4 may reduce manufacturing time and expense. Manufacturing time and/or expenses can be reduced by reducing the number of tools required to form one or more joints. All of the joints can be formed with a single too, the 3-D printer. Similarly, manufacturing time and/or expenses can be reduced by a higher level of quality control compared to other manufacturing techniques that is provided by the 3-D printer. For example the cost of producing joints using the method previously described may reduce manufacturing costs by at least 5%, 10%, 15%, 20%, 30%, 40%, 50%, 60%, 70%, 80%, or 90% compared to other methods. The use of 3-D printing for the manufacturing of joints to connect tubes in a space frame allows each joint to have different shape and dimensions without requiring separate molds or tools for each joint. The 3-D printing process for joints may be easily scaled.

Figure 5:
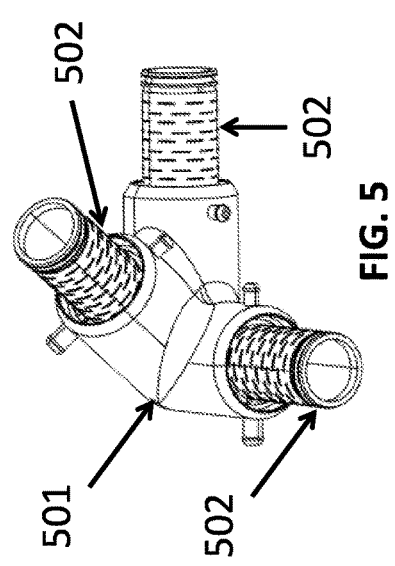
FIG. 5 shows an example of a joint printed using the method described herein.

An example of a joint that may be manufactured using the described 3-D printing method is shown in FIG. 5. The joint shown in FIG. 5 has a body portion 501 and three acceptor ports 502 exiting the joint body. The acceptor ports 502 may be locations for mating with a connecting tube. The acceptor ports may mate with a connecting tube by being inserted into an interior portion of the connecting tube and/or overlying an exterior surface of the connecting tube. The acceptor ports may have any angle relative to each other in three dimensional space. The angle of the ports relative to each other may be dictated by the chassis design. In some instances, three or more ports may be provided. The three or more ports may or may not be coplanar. The ports may be able to accept round, square, oval, or irregularly shaped tubes. Different cross-sectional shapes/dimensions for connecting tubes, ports may be configured to accommodate the different shapes/dimensions of tubes, the ports themselves may have different cross-sectional shapes/dimensions. The ports may be round, square, oval, or irregularly shaped.

The protrusion 502 may be designed such that it may be inserted in to a connecting tube. The wall thickness of the joint protrusion may be printed such that the joint is able to support the structural load calculated by a finite element model for the complete chassis design. For example a joint that needs to support a large magnitude load may have a thicker wall than a joint that supports a smaller load.

Figure 6:
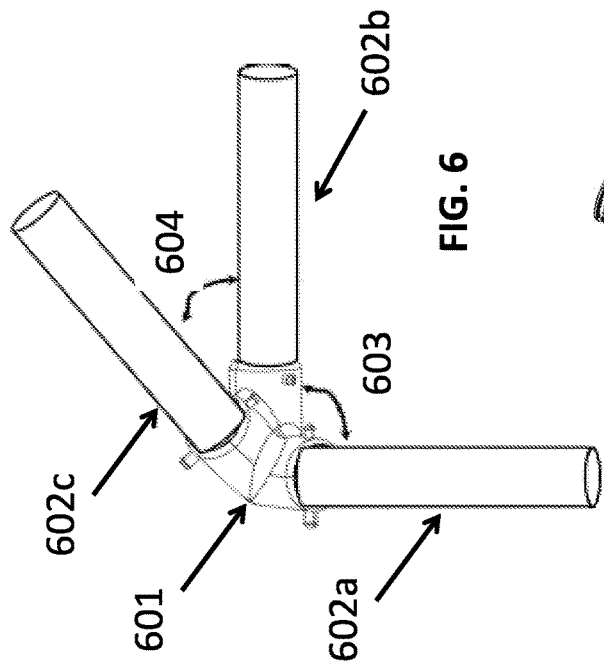
FIG. 6 shows a joint connected to tubes where the tubes are at non-equal angles relative to each other.

FIG. 6 shows a joint 601 connecting with three tubes 602a-c. The figure shows how the joint can be designed to connect tubes at varying angles. The angles between a set of tubes connecting to a joint may be equal or non-equal. In the example show in FIG. 6 two of the angles are labeled, the angle between tube 602a and 602b is labeled 603 and the angle between tubes 602b and 602c is labeled 604. In FIG. 6 angles 603 and 604 are not equal. Possible values for 603 and 604 can be at least 1°, 5°, 10°, 15°, 20°, 30°, 45°, 60°, 75°, 90°, 105°, 120°, 135°, 150°, 165°, or 180°.

Figure 8:
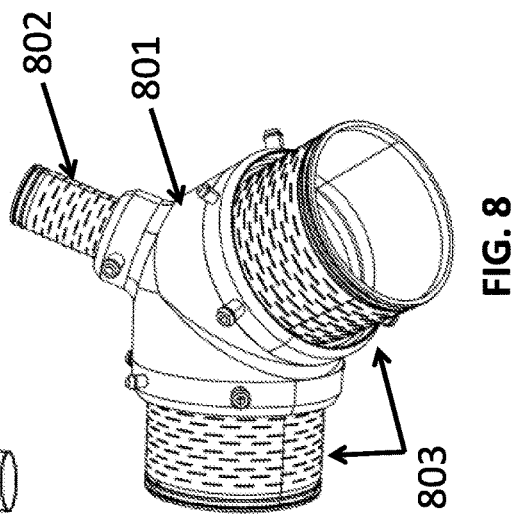
FIG. 8 shows a joint printed to connect with tubes of non-equal cross-section size.
Figure 7:
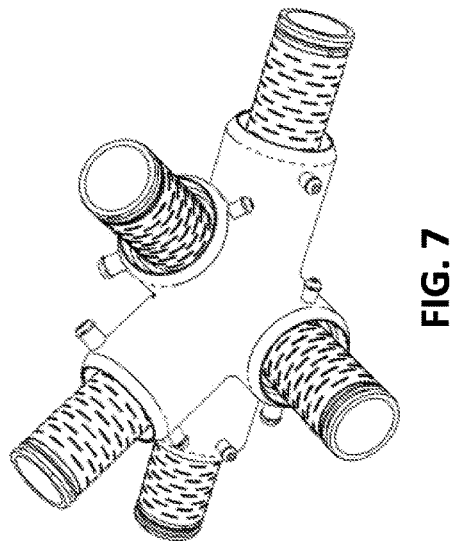
FIG. 7 shows a joint with 5 protrusions.

Joints may be printed with any number of protruding acceptor ports to mate with a connecting tube. For example, the joint may have at least one, two, three, four, five, six, seven, eight, nine, ten, twelve, fifteen, twenty, thirty, or fifty acceptor ports, or prongs. The joint may have less than any of the number of acceptor ports described herein. The joint may have a number of acceptor ports falling into a range between any two of the values described herein. FIG. 7 shows an example of a joint with five protrusions. Furthermore, the protrusions may have equal or non-equal diameters. For example, FIG. 8 shows a joint 801 designed to accept tubes of different diameters with a smaller tube being accepted at the upper port 802 and larger tubes accepted at the lower ports 803. In another example, different ports on the same joint may be able to accept tubes with a diameter ratio between different tubes of 1:2, 1:3, 1:4, 1:5, 1:6, 2:3, 2:5, 2:7, 3:5, or 3:7. In the case of non-round tubes, diameter could be represented by the relevant fundamental length scale, for example side length in the case of a square tube. Additionally, tubes with different cross sectional shapes may be able to fit on to different protrusions on the same joint. For example, a joint may have protrusions with all or any combination of round, oval, square, rectangular, or irregularly shapes. In other implementations, a single joint may have protrusions with equal diameters and/or the same shape. 3-D printing of the joint may accommodate this wide array of joint configurations.

The joint may be printed such that it comprises a region of the protrusion configured to fit inside of a connecting tube and a lip to fit over the connecting tube. The joint protrusion configured to fit inside of the connecting tube may be printed such that an annular region may be formed between the surface of the protrusion and the inner diameter of the lip.

The 3-D printing method described herein may permit inclusion of fine structural features which may be impossible or cost prohibitive using other fabrication methods. For example centering features may be printed on the protrusion region of the joint. Centering features may be raised bumps or other shapes in a regular or irregular pattern on the joint protrusion. Centering features may center the joint protrusion inside of a connecting tube when a joint and tube are assembled. If adhesive is placed between the joint protrusion and the connecting tube, centering features may create fluid pathways to spread the adhesive in a desired thickness or location. In another example nipples may be printed on to the joints. Nipples may provide vacuum or injection ports for introduction of adhesive in a space between a joint protrusion and a connecting tube. In some cases, the centering features can promote even distribution of adhesive in the space between the joint protrusion and the connecting tube as described in detail elsewhere herein.

Figure 9D:
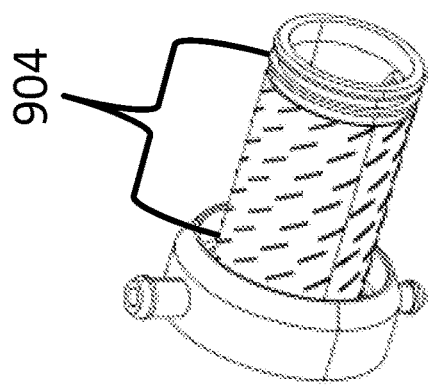
FIG. 9a-d show examples of centering features printed on joints.
Figure 9C:
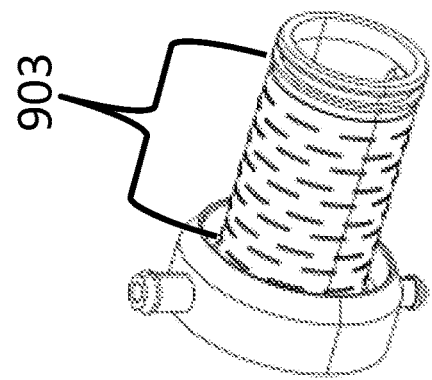

Centering features may comprise a raised printed pattern on the joint protrusion designed to fit inside of a connecting tube. The centering features may be printed on the joint protrusion when the protrusion is originally formed or they may be printed on the joint protrusion some time after the joint has been designed. The centering feature may be raised from an outer surface of a protrusion of the acceptor port (tube engagement region). The height of a raised centering feature may be at least 0.001", 0.005", 0.006", 0.007", 0.008", 0.009", 0.010", 0.020", 0.030", 0.040", or 0.050". Centering features may preferably be printed on the region of the protrusion configured to fit inside of the connecting tube as shown in FIG. 9a-d. In an alternative embodiment the centering features may be printed on the lip region on the joint configured to fit over the outer diameter of the connecting tube in addition to or instead of printing the centering features on the tube engagement region. The centering features may be printed on either or both the protrusion configured to fit inside of the connecting tube and the lip region on the joint configured to fit over the outer diameter of the connecting tube FIGS. 9a-d show detailed views of four possible joint centering feature embodiments. FIG. 9a shows a small nub centering feature 901, this feature comprises a pattern of raised dots on a tube engagement region of the joint protrusion. A tube engagement region of the joint protrusion may be a portion of the joint protrusion configured to come into contact with a surface of the tube. The tube engagement region may be configured to be inserted into the tube. The dots may be provided in one or more row or column, or in staggered rows and/or columns. The raised dots may have a diameter of at least 0.001", 0.005", 0.006", 0.007", 0.008", 0.009", 0.010", 0.020", 0.030", 0.040", or 0.050".

Figure 9B:
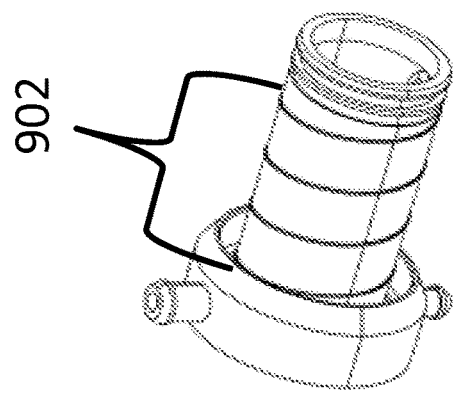
Figure 9A:
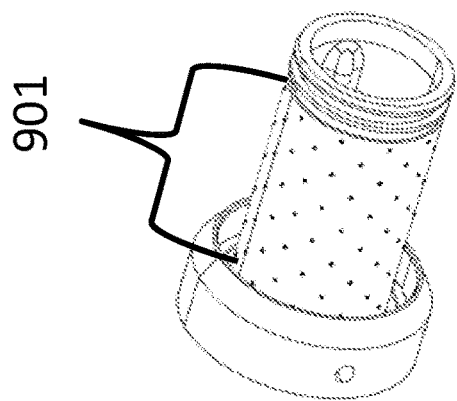

FIG. 9b shows a spiral path centering feature 902, this feature comprises a continuous raised line that winds around the full length of the tube engagement region of the joint protrusion. The continuous raised line may wrap around the tube joint protrusion a single time or multiple times. Alternative designs may comprise centering features with a raised spiral centering feature that does not wrap around the full diameter of the tube engagement region. In alternative embodiments the spiral centering feature may wind around 10°, 20°, 30°, 40°, 50°, 60°, 70°, 80°, 90°, 100°, 110°, 120°, 130°, 140°, 150°, 180°, 190°, 200°, 210°, 220°, 230°, 240°, 250°, 260°, 270°, 280°, 290°, 300°, 310°, 320°, 330°, 340°, 350°, or the full 360° of the circumference of the engagement region. The centering feature may further comprise multiple raised lines that wind around the full length of the tube without intersecting in a fashion similar to multi-start screw threads.

FIG. 9c shows a labyrinth centering feature 903, this feature comprises raised dashed lines circumscribing the tube engagement region of the joint at a 90 degree angle to the direction of the length of the joint protrusion. Adjacent dashed lines in the labyrinth centering feature are organized in a staggered pattern. Multiple rows of dashed lines may be provided. The dashed lines may be substantially parallel to one another. Alternatively, varying angles may be provided.

FIG. 9d shows an interrupted helix centering feature 904, this feature comprises raised dashed lines circumscribing the tube engagement region of the joint at a 45 degree angle to the direction of the length of the tube engagement region. In another example, the centering feature could have a raised line circumscribing the tube engagement region at an angle of 1°, 5°, 10°, 15°, 20°, 30°, 45°, 60°, 75°, 90°, 105°, 120°, 135°, 150°, 165°, or 180°. The dashed lines in the centering features shown in FIG. 9c and FIG. 9d may have a length of at least 0.005", 0.006", 0.007", 0.008", 0.009", 0.010", 0.020", 0.030", 0.040", 0.050" or 0.100".

Other patterns in addition to those described in FIG. 9a-FIG. 9d may be used. Alternative patterns may include dashed lines at irregular angles or spacing, a combination of lines and dots, or a group of solid lines winding around the engagement region with uniform or non-uniform spacing between the lines. In some instances, the centering features may be patterned so a direct straight line may not be drawn from a distal end of an inner protrusion to the proximal end without intersecting one or more centering feature. This may force adhesive to take a more roundabout path and encourage spreading of the adhesive, as described further elsewhere herein. Alternatively, a straight line may be provided from a distal end to a proximal end of the inner protrusion without intersecting one or more centering feature.

The centering features may be printed on the joint protrusion with different densities. For example, a joint protrusion may be printed such that 90% of the protrusion is covered with raised centering features. In the case with 90% centering feature coverage the features may be very closely spaced. Alternatively the centering features may cover at least 5%, 10%, 15%, 20%, 25%, 30%, 40%, 45%, 50%, 55%, 60%, 65%, 70%, 75%, 80%, 85%, 90%, or 95% of the protrusion. The centering features may cover less than any of the percentages described herein. The centering features may fall within a range between any two of the percentage values described herein. The density of the centering features printed on the joints may be chosen to provide a structural feature as determined from the chassis model.

The centering features may be raised such that a joint/tube assembly comprises space between an inner surface of the connecting tube and the surface of the joint protrusion designed to enter into a connecting tube. The tolerance between the inner tube diameter and the protrusion may be such that the joint and tube form a force fit connection. In the case of a force fit connection, centering features may or may not deform upon tube insertion in to the joint. The centering features may center the joint protrusion inside of a connecting tube such that the distance between the inner surface of the connecting tube and the surface of the joint protrusion may have a uniform radial thickness. Alternatively the centering features may encourage non-uniform distribution of the space between the joint protrusion and the connecting tube.

Figure 10:
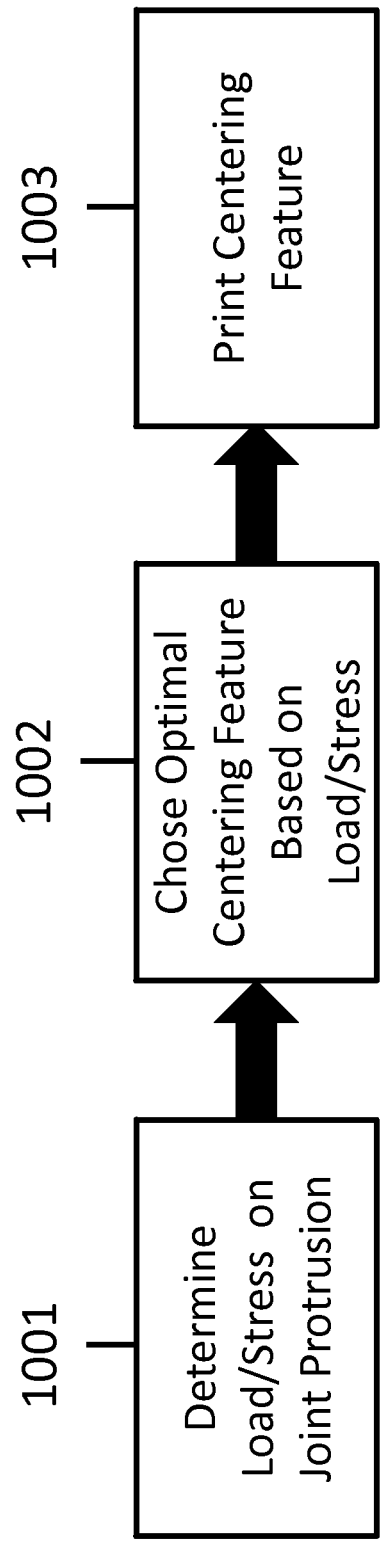
FIG. 10 shows a flow chart describing a method to choose centering features based on an expected load or stress on a joint.

Different centering features may be printed on different joints in the same chassis structure. Different centering features can be printed on different joint protrusion on the same joint. The centering features printed on a joint protrusion may be chosen so that the joint supports a stress profile determined by a finite element analysis performed on the chassis structure. An example of a method to determine a centering feature to print on a joint is shown in FIG. 10. In this method the first step 1001 is to determine the load or stress on a joint protrusion. The stress may be calculated using a finite element analysis employing a linear or non-linear stress model. Stress may be calculated on the joints while the chassis is stationary or while the chassis is moving along a typical path, for example, along a straight line, curved trajectory, flat terrain, or hilly terrain. The calculated stress on the joint may be shear, tensile, compressive, torsional stress, or a combination of stress types. The next step in the method shown in FIG. 10 is to choose a centering feature that will provide optimal structural support for the determined stress or load profile 1002. Choosing a centering feature may involve choosing any combination of pattern, dimension, and density of a possible centering feature. The final step in the process may be to print the centering feature on the joint.

For example, a joint that is expected to experience a high magnitude tension force may be printed with a small nub centering feature such that that an adhesive contact area between the joint and the tube is maximized. In another example, a joint that is expected to experience a torsional stress in the clockwise direction may be printed with a spiral centering feature in the clockwise direction to provide resistance to the torsional force.

The dimension and density of the centering features may also be chosen so that the joint supports a stress profile determined by a computational and/or empirical analysis performed on the chassis structure. The height of the centering feature may dictate the volume of the annulus formed between the surface of the joint protrusion and the inner diameter of a connecting tube. The volume of the annulus may be filled with adhesive when the joint and tube are assembled. The centering feature height may be chosen such that the volume of adhesive is optimized to support the expected stress or load on the joint. The density of centering features may also alter the volume of the annular region. For example, a joint with a high density of centering features may have a smaller volume in the annular region compared to a joint with a sparse density of centering features. The centering feature density may be chosen such that the volume of adhesive is optimized to support the expected stress or load on the joint.

Nipples for the connection of vacuum or injection tubing may be printed directly on the joint. The nipples may be printed on the joint at the time that the joint is printed such that the joint and the nipples may be carved from the same bulk material. Alternatively the nipples may be printed separately and added to the joint after it is printed. The nipples may have delicate internal pathways that may be impossible to achieve with manufacturing methods other than 3-D printing. In some cases, fluid can be delivered to an annular space between the tube accepting region of the protrusion and an inner diameter of a tube attached to the protrusion through the nipple and/or the internal pathways in fluid communication with the nipple. The fluid can be an adhesive. Adhesive may be sucked or pushed into the annular region through the printed nipples. The nipples may be positioned on opposite sides of the joint to distribute adhesive uniformly. Two or more nipples can be attached to the joint symmetrically or asymmetrically. For example, they may be provided circumferentially opposing one another on an acceptor port of a joint. They may be provided at or near a proximal end of an acceptor port for a joint. Alternatively, they may be provided at or near a distal end of an acceptor port of the joint, or any combinations thereof. A joint may have at least about 1, 2, 3, 4, 5, 10, 15, or 20 nipples on each protrusion.

Figure 11:
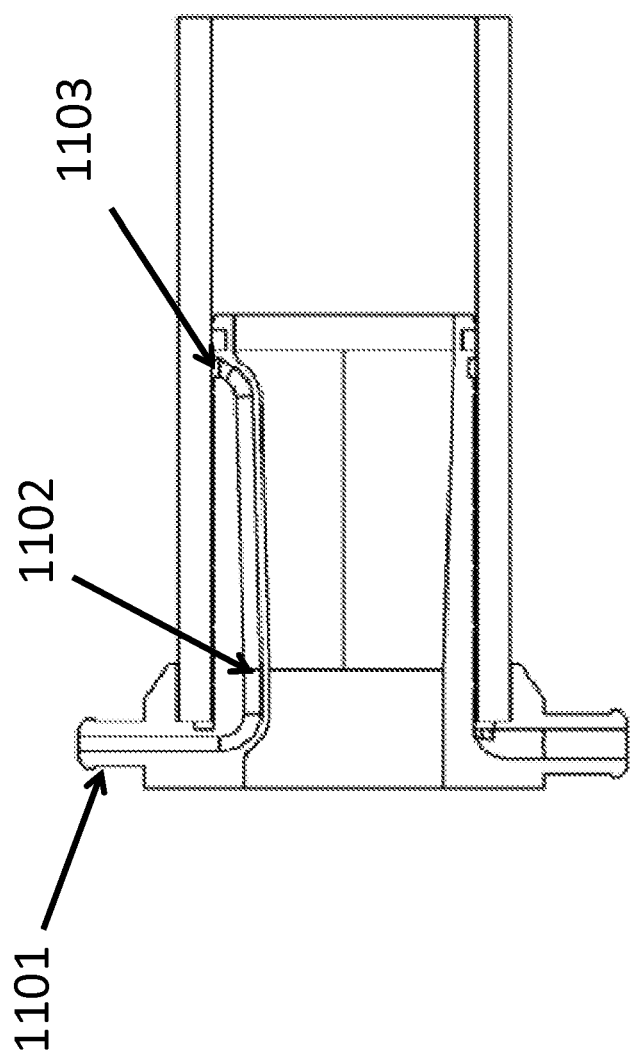
FIG. 11 shows a cross section of a joint protrusion with nipples connecting to internal passageways in the side wall of the joint protrusion.

Nipples can be positioned far from, in close proximity to, or co-axially with an internal joint feature such as the fluid pathway inside of a wall of the inner joint protrusion which may provide uniform adhesive coating. FIG. 11 shows a cross section of an example of a joint protrusion with nipples 1101 connecting to an internal fluid pathway 1102 inside the wall of the joint protrusion. The internal pathway may be printed in the side wall of the joint. The internal pathway may have an outlet 1103 in to the annular region. The internal pathway may introduce fluid (e.g. adhesive) into the annular region. The internal pathway may have a round cross section, a square cross section, an oval cross section, or an irregularly shaped cross section. The diameter of the internal pathway may be at least $\frac{1}{100}$", $\frac{1}{64}$", $\frac{1}{50}$", $\frac{1}{32}$", $\frac{1}{16}$", $\frac{1}{8}$", $\frac{1}{4}$", or $\frac{1}{2}$". If the internal fluid pathway has a non-round cross section the listed diameters may correspond to a relevant fundamental length scale of the cross section. The fluid pathway may run along the full length of the joint protrusion or any fraction of the length.

Nipples can be shaped and configured to connect with vacuum and/or pressure injection equipment. Printing nipples directly on the joint may decrease the need for equipment to inject adhesive in to the annular region. After adhesive is introduced the nipples may be removed from the joint by cutting or melting the nipple off of the joint.

Integrated structural features may be printed directly on to or inside of the joints. Integrated structural features may include fluid plumbing, electrical wiring, electrical buses, panel mounts, suspension mounts, or locating features. Integrated structural features may simplify the chassis design and decrease the time, labor, parts, and cost needed to construct the chassis structure. The location for the integrated structural features on each joint may be determined by the chassis model and the software may communicate with a 3-D printer to fabricate each joint with the necessary integrated structural features for a chosen chassis design.

Joints may be printed such that they comprise mounting features for shear panels or body panels of a vehicle. Mounting features on the joints may allow panels to be connected directly to a vehicle chassis frame. Mounting features on the joints may be designed to mate with complimentary mating features on the panels. For example mounting features on the joints may be flanges with holes for hardware (e.g. screws, bolts, nuts, or rivets), snaps, or flanges designed for welding or adhesive application. FIGS. 12a-c show features of the joints designed for integration with other systems on-board a structure, such as a vehicle. Joints may be designed to integrate with shear panels or body panels of a structure.

FIG. 12a shows a joint with a flange 1201. The flange 1201 may be used to connect to a shear panel or body panel (not shown). In the case of use of the joint members to construct a vehicle chassis, the joint member may be integrated with a suspension system. A suspension system may comprise hydraulic, air, rubber, or spring loaded shock absorbers. The suspension system may connect to the joint member by an attachment to a flange 1201. The flange may be printed such that it contains at least one hole 1202 for mating with connecting hardware (e.g. screw, nail, rivet).

Joints may be printed such that they include integrated passageways for electrical connections. Electrical connections integrated into the joints may be electrically insulated. Electrical connections integrated into the joints may be grounded. Electrical connections integrated into the joints may be in communication with wiring routed through the tubes connected to the joint. The electrical wiring may be used to provide power to systems on board a vehicle and/or to provide power to a battery to start or run the vehicle engine. Systems on board a vehicle that use power from the integrated joints may include navigation, audio, video display, power windows, or power seat adjustment. Power distribution within a vehicle may travel exclusively through a tube/joint network. FIG. 12b shows a possible joint embodiment for routing of electrical wires throughout a structure. The joint shown in FIG. 12b has with an inlet region 1203; this inlet could be used for insertion of electrical connections or wires. Electrical wires may be inserted into the inlet region and routed from the joint to the tube for transmission throughout the chassis. One or more system that may be powered using the electrical wires may connect with the wire through the inlet region. The electrical connections integrated into the joints can provide plugins that permit a user to plug in one or more devices to obtain power for the device. In some cases, one or more electrical contacts can be printed onto the joints before, after, or during 3-D printing of the joints.

Joints may be printed such that they comprise an integrated heating and cooling fluid system to provide heat and air conditioning in the vehicle chassis. Other applications may include cooling and/or heating various components of the vehicle. Integration of fluid (e.g. gas or liquid) systems into the joint/tube construction may partially or fully eliminate the need for conventional air ducts and plumbing from vehicle design. Joints may route hot or cold fluid from a production source (e.g. electric heating element, engine block heat exchanger, refrigerator, air conditioning unit, or boiler) to a location in the chassis where a passenger or vehicle operator may wish to heat or cool the interior. Joints may contain integrated components to intake hot or cold fluid from a source, distribute hot or cold fluid, and vent hot or cold fluid at a location away from the source. Joints and tubes in the assembly may be thermally insulated using fiberglass, foam insulation, cellulose, or glass wool. The joint and tube assembly may be fluid tight. In the case of a joint comprising an integrated fluid system the joint embodiment shown in FIG. 12b may be used. An inlet such as the one illustrated in the FIG. 1203 may be used to route fluid for heating or cooling throughout a structure by means piping the fluid between a plurality of joints through the connector tubes.

A cross sectional view of a joint that may be used for routing of fluid or electricity is shown in FIG. 12c. In the example shown in FIG. 12c two joint protrusions are joined by an internal passageway 1204. In an embodiment the joint in FIG. 12c may route fluid or wiring from the inlet at 1205 to the outlet at 1206. The passageways used for routing of fluid and electricity may be the same passageways or they may be separate. Internal joint routing may keep two or more fluids separate within a joint while still providing desired routing between tubes, or from tube to joint-mounted connectors or features.

Joints may be printed such that they include integrated locating or identifying features. The features may enable automated identification or handling of the joints during assembly and processing. Examples of locating features may include a cylindrical boss (e.g. a boss with a flat and radial groove), an extruded C-shape with a cap, a bayonet or reverse bayonet fitting with a non-symmetric pin pattern, a hook feature, or other features with geometry that may uniquely define the feature orientation and position when examined. These locating features may be interfaced to or grasped by robotic grippers or work holding tools. The interface of the joint may be fully defined once the grasping motion begins, is partially finished, or is complete. The locating features may enable repeatable and optionally automated positioning of the joints prior to and during space frame assembly. The defining geometry of the features may also enable automated systems to coordinate the motion of multiple joints along defined paths in space during insertion of tubes into the joints. At least two tubes may be inserted into multiple joints in parallel without resulting in geometric binding during assembly. The integrated locating feature may further comprise integral identifying features. For example identifying features may be a one dimensional bar code, a two dimensional QR code, a three dimensional geometric pattern, or a combination of these elements. The identifying feature may encode information about the joint to which it is attached. This joint information may include: geometry of the joint, including the orientation of the tube entries relative to the identifying/location feature; material of the joint; positioning of adhesive injection and vacuum ports relative to the identifying/locating features; adhesive required by the joint; and joint tube diameters. The combined identifying/locating feature may enable automated positioning of joints for assembly without requiring external information to be supplied to the automated assembly cell.

Any of the features described herein may be printed with the rest of the joint. For example, the entire joint including the various features described herein (e.g., centering features, nipples, passageways, etc.) may be printed in a single step and formed a single integral material. Alternatively, specific features may be printed onto a pre-existing joint component. For example, a center feature may be printed onto an existing acceptor port.

The 3-D printing method of joint fabrication may be a high efficiency manufacturing process. A single set of equipment may be configured to generate a variety of joint geometries with varying detailed features. The production may have lower time and cost requirements compared to traditional manufacturing methods, furthermore the process may be easily scaled from small volume production to large volume production. The process may provide superior quality control over traditional manufacturing methods which may reduce waste associated with misshapen parts and the time required to re-make parts which may not meet a standard of quality control.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A method of fabricating a joint member for connection of a plurality of connecting tubes forming a space frame, the method comprising: determining a relative tube angle, tube size, and tube shape for each of the plurality of connecting tubes to be connected by the joint member;
determining a stress direction and magnitude to be exerted by the plurality of connecting tubes at the joint member; and
3-D printing the joint member having a configuration that accommodates the relative tube angle,
tube size, and tube shape at each joint member, and supports the stress direction and magnitude exerted by the plurality of connecting tubes; and
wherein the joint member comprises a joint protrusion on sidewalls of connecting tubes configured to be inserted into a connecting tube, and
one or more nipples configured to allow introduction of adhesive in a space between the joint protrusion on the sidewalls of nipples and at least on one of the connecting tube side walls.

2. The method of claim 1, wherein the space frame is configured to at least partially enclose a three-dimensional volume.

3. The method of claim 1, wherein each connecting tube of the plurality of connecting tubes has a longitudinal axis along a different plane.

4. The method of claim 1, wherein the space frame is a vehicle chassis frame.

5. The method of claim 1, further comprising 3-D printing centering features on at least a portion of the joint member, wherein the centering features comprise a regular or irregular pattern of raised bumps.

6. The method of claim 5, wherein the centering features are printed on the joint protrusion of the joint member configured to be inserted into a connecting tube.

7. The method of claim 5, wherein the characteristics of the centering features are determined based on the stress direction and magnitude to be exerted by the plurality of connecting tubes at the joint member.

8. The method of claim 1, wherein the stress direction and magnitude to be exerted by the plurality of connecting tubes at the joint member is determined empirically or computationally.

9. The method of claim 1, wherein the nipples are 3-D printed on the joint member at the time that the joint member is printed and are carved from the same bulk material.

10. The method of claim 1, wherein the nipples are positioned on opposite sides of the joint member.

11. A method of fabricating a joint member for connection of a plurality of connecting tubes forming a space frame, the method comprising:
receiving, by a computer,
a design describing the space frame;
determining specifications, by the computer, of the plurality of connecting tubes,
wherein the specifications comprise a relative tube angle, tube size, and tube shape for each of the plurality of connecting tubes to be connected by the joint member;
determining structural requirements, by the computer,
wherein the structural requirements comprise a stress direction and magnitude to be exerted by the plurality of connecting tubes at the joint member; and
3-D printing the joint member, wherein the joint member has a configuration that accommodates the relative tube angle, tube size, and tube shape at each joint member, and
supports the stress direction and magnitude exerted by the plurality of connecting tubes wherein the joint member comprises a joint protrusion on sidewalls of connecting tubes configured to be inserted into a connecting tube, and one more nipple configured to allow introduction of adhesive in a space between the joint protrusion on the sidewalls of nipples and at least one of the connecting tubes side walls.

12. The method of claim 11, wherein the space frame is configured to at least partially enclose a three-dimensional volume.

13. The method of claim 11, wherein each connecting tube of the plurality of connecting tubes has a longitudinal axis along a different plane.

14. The method of claim 11, wherein the space frame is a vehicle chassis frame.

15. The method of claim 11, wherein the computer is a server.

16. The method of claim 11, wherein the received design comprises a 3D model describing a framework of a vehicle chassis.

* * * * *